United States Patent [19]

Futamase et al.

[11] Patent Number: 4,731,835

[45] Date of Patent: Mar. 15, 1988

[54] REVERBERATION TONE GENERATING APPARATUS

[75] Inventors: Tsuyoshi Futamase; Mitsumi Kato, both of Hamamatsu, Japan

[73] Assignee: Nippon Gakki Seizo Kabushiki Kaisha, Hamamatsu, Japan

[21] Appl. No.: 22,582

[22] Filed: Mar. 10, 1987

Related U.S. Application Data

[63] Continuation of Ser. No. 673,048, Nov. 19, 1984, abandoned, which is a continuation of Ser. No. 397,449, Jul. 9, 1982, abandoned.

[51] Int. Cl.$^4$ .............................................. H03G 3/00
[52] U.S. Cl. ................................. 381/63; 84/DIG. 26
[58] Field of Search ...................... 381/62, 63; 84/1.24, 84/DIG. 4, DIG. 26

[56] References Cited

U.S. PATENT DOCUMENTS

| | | | |
|---|---|---|---|
| 4,005,268 | 1/1977 | Canell et al. | 381/63 |
| 4,105,864 | 8/1978 | Berkovitz | 381/63 |
| 4,219,880 | 8/1980 | Nichols | 381/63 |
| 4,237,343 | 12/1980 | Kurtin et al. | 381/63 |
| 4,349,697 | 9/1982 | Skabla | 381/63 |
| 4,389,915 | 6/1983 | Bione | 84/1.24 |
| 4,392,405 | 7/1983 | Franz et al. | 84/1.24 |

FOREIGN PATENT DOCUMENTS

| | | |
|---|---|---|
| 2431989 | 1/1976 | Fed. Rep. of Germany . |
| 2447226 | 4/1976 | Fed. Rep. of Germany . |
| 2360983 | 7/1979 | Fed. Rep. of Germany . |
| 3037276 | 10/1980 | Fed. Rep. of Germany . |

OTHER PUBLICATIONS

Chamberlin, Musical Applications of Microprocessors, pp. 462-467, 593-600, 614-617 (Published 1980).

Primary Examiner—Forester W. Isen
Attorney, Agent, or Firm—Blakely, Sokoloff, Taylor and Zafman

[57] ABSTRACT

In a reverberation tone generating apparatus a digital memory device is used as a delay element. Amplitude data obtained by sampling an input musical tone at a predetermined period are sequentially stored in the digital memory device. The readout of the amplitude data stored before a desired delay time is equal to the readout of the data regarding the input musical tone delayed the desired delay time. By imparting the desired reverberation characteristics to the delayed amplitude data, reverberation tone of the input musical tone is produced. In a modified embodiment, an input musical tone is divided into a plurality of frequency bands and different reverberation characteristics are added to the divided input musical tones respectively. This utilization of the digital memory as the delay element prevents degrading S/N ratio even if the delay time or the reverberation time is elongated and makes it possible to easily change the reverberation time, thereby enabling to generate a reverberation tone having the same quality as a natural reverberation tone.

12 Claims, 26 Drawing Figures

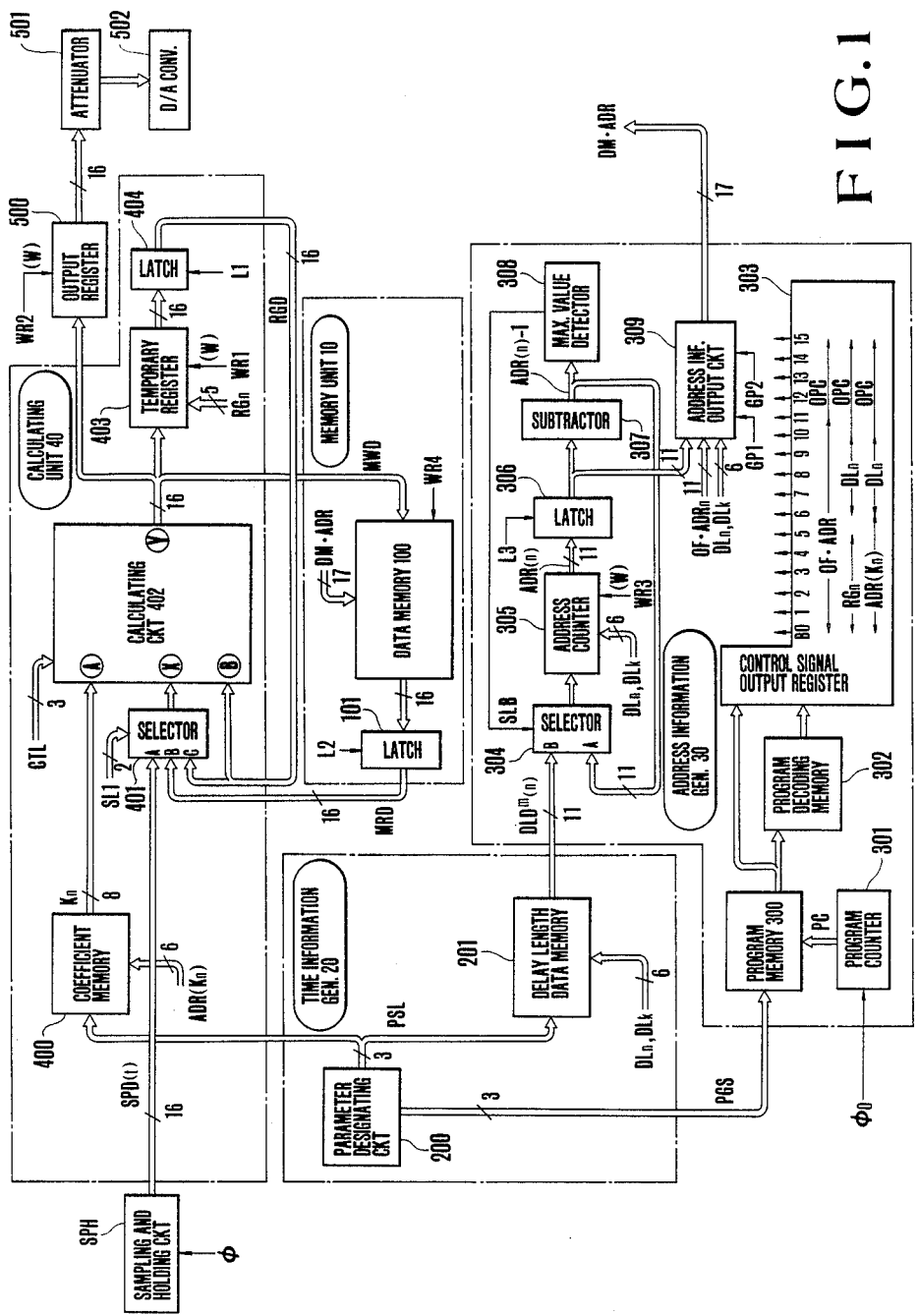
F I G. 1

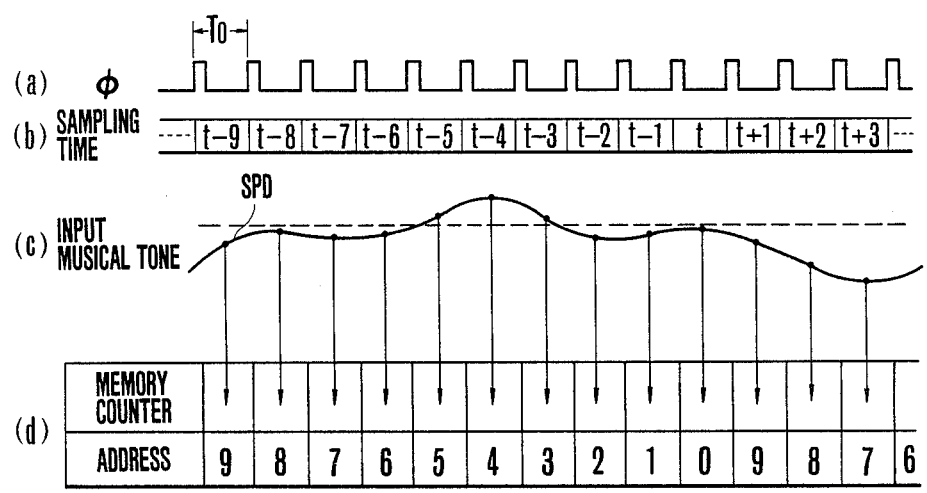
FIG.5
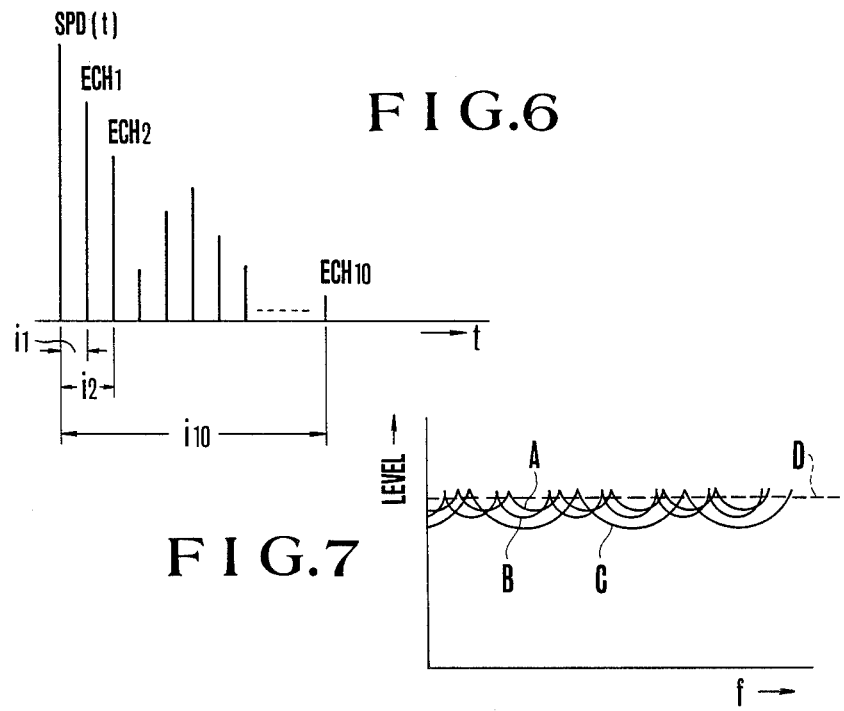
FIG.6
FIG.7

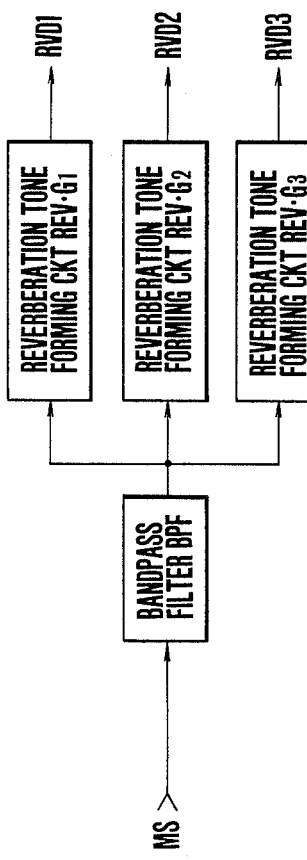
FIG.16a
FIG.16b
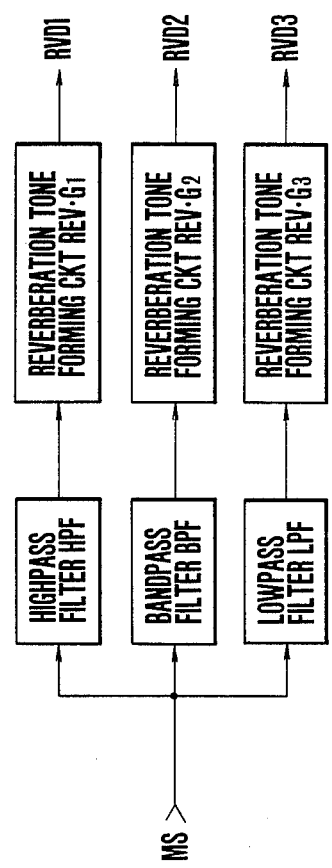
FIG.17a
FIG.17b

REVERBERATION TONE GENERATING APPARATUS

This is a continuation of application Ser. No. 673,048 filed 11/19/84 which is a continuation of application Ser. No. 397,499, filed July 9, 1982, both of which are now abandoned.

BACKGROUND OF THE INVENTION

This invention relatres to a reverberation tone generating apparatus.

The apparatus utilized for adding a reverberation tone to a musical tone can be classified into a mechanical reverberation apparatus, and an electronic circuit utilizing such an analog delay element as a BBD (bucket brigade device) or a CCD (charge coupled device). However, since the former involves various problems regarding constructions and characteristics, the latter type is used in recent years. An example of using a BBD is disclosed in U.S. Pat. No. 4,093,820. In the apparatus utilizing such analog delay element, however, as the reverberation time is elongated, or as the number of serially connected stages of the analog delay elements increases, the output level decreases to greatly decrease the S/N ratio, thus making it impossible to obtain a natural reverberation tone. Moreover, as the reverberation tone time is principally determined by the number of stages of the serially connected analogue delay elements, when the reverberation time is once set, it is difficult to simply change it thereafter.

When adding a reverberation tone to a performed musical tone it is desirable to change the reverberation tone characteristics (length, depth, etc.) in accordance with the frequency band of the performed tone depending upon the tone color or the like of the performed musical tone so as to improve the performance effect.

Where a musical tone is performed in an indoor room, the low frequency component of the performed musical tone has a long reverberation time, while the high frequency component has a short reverberation time period. For this reason, an ideal reverberation tone having uniform reverberation characteristics over entire frequency range can be obtained by varying the reverberation characteristics in accordance with the frequency band of the performed musical tone.

In the prior art reverberation tone generating or adding apparatus, however, a reverberation tone is added to a musical tone signal produced by such a musical tone source as an electronic musical instrument without dividing the signal into different frequency bands so that it has been impossible to add an optimum reverberation tone suitable for the tone color of the performed musical tone or a place of performance.

SUMMARY OF THE INVENTION

Accordingly, it is an object of this invention to provide a novel reverberation tone generating apparatus in which the S/N ratio is not degraded even when the reverberation time is elongated and the reverberation time can be varied readily.

Another object of this invention is to provide an improved reverberation tone generating apparatus capable of adding an optimum reverberation tone suitable for the tone color of a performed tone and a place of performance.

Still another object of this invention is to provide a reverberation tone generating apparatus capable of generating a reverberation tone having complicated characteristics with circuits of small size.

According to this invention there is provided a reverberation tone generating apparatus comprising a memory device for sequentially storing amplitude data representing an amplitude value of egarding an input musical tone according to clock pulses having a predetermined period, delay time information generating means for generating a delay time information that determines a delay time of a reverberation tone to be generated, address information generating means for generating a first address information for designating a first area in said memory device to store amplitude input data which is the amplitude data of said musical tone at a present time and a second address information for designating a second area in said memory device to read out an amplitude output data which is equal to the amplitude input data stored in the memory device at a time preceding the present time by a time interval designated by the delay time information, level control means for controlling a level of the amplitude output data, and converting means for converting the level-controlled amplitude output data to a reverberation tone of the input musical tone.

DESCRIPTION OF THE DRAWINGS

In the accompanying drawings:

FIG. 1 is a block diagram showing one embodiment of the reverberation tone generating apparatus embodying the invention;

FIG. 5 is a timing chart useful to explain the operation of the delay circuit shown in FIG. 3;

FIG. 6 is a graph showing the initial reflected tone (echo) generated in the embodiment shown in FIG. 1;

FIG. 7 is a graph showing the frequency characteristic of a delay circuit having a comb type filter construction;

FIGS. 16a through 20a are block diagrams showing other embodiments of this invention;

FIGS. 16b through 20b show reverberation characteristics generated by the embodiments shown in FIGS. 16a through 20b respectively.

DESCRIPTION OF THE PREFERRED EMBODIMENTS

Figure 2:
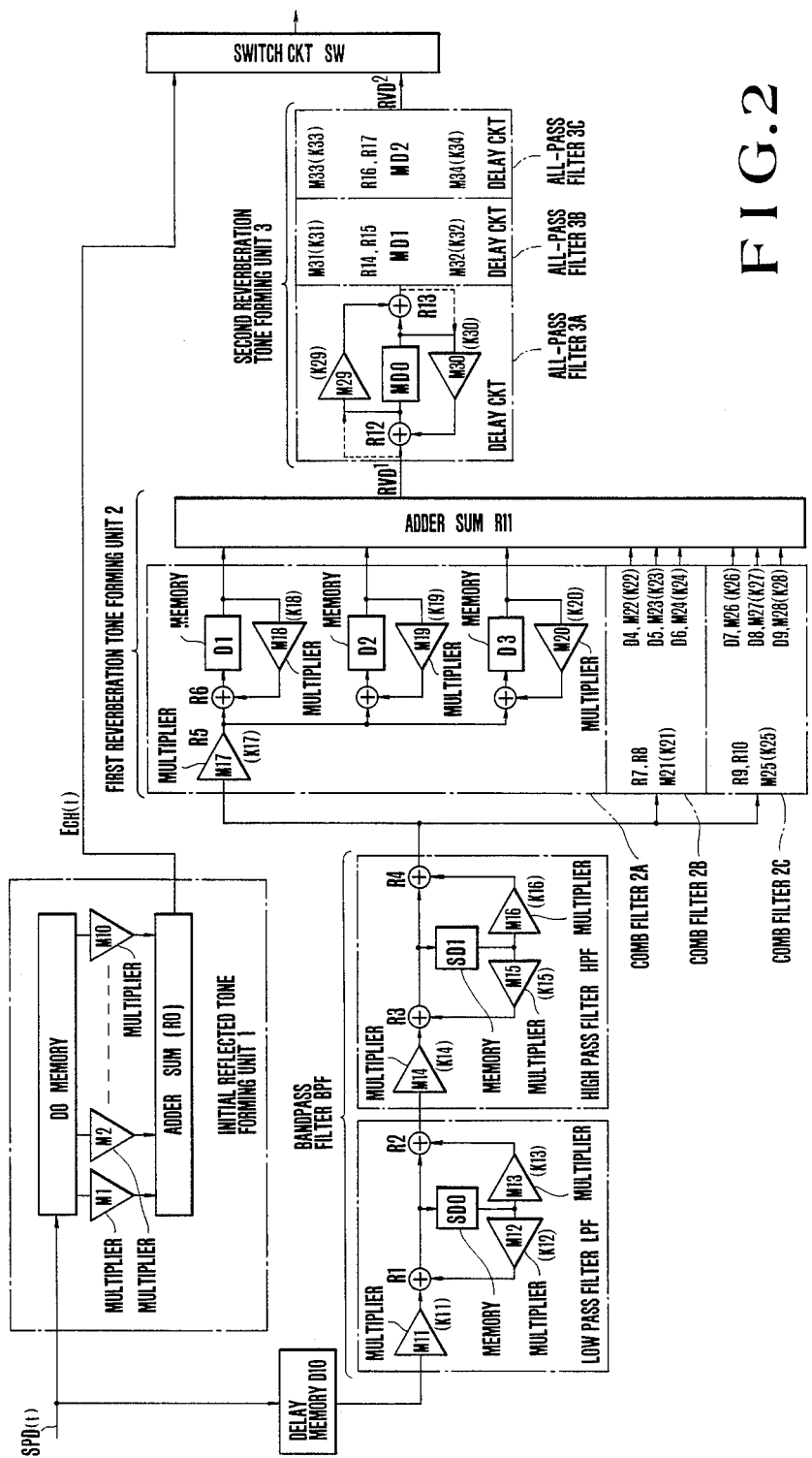
FIG. 2 is a functional block diagram showing the performances of the embodiment shown in FIG. 1.
Figure 3:
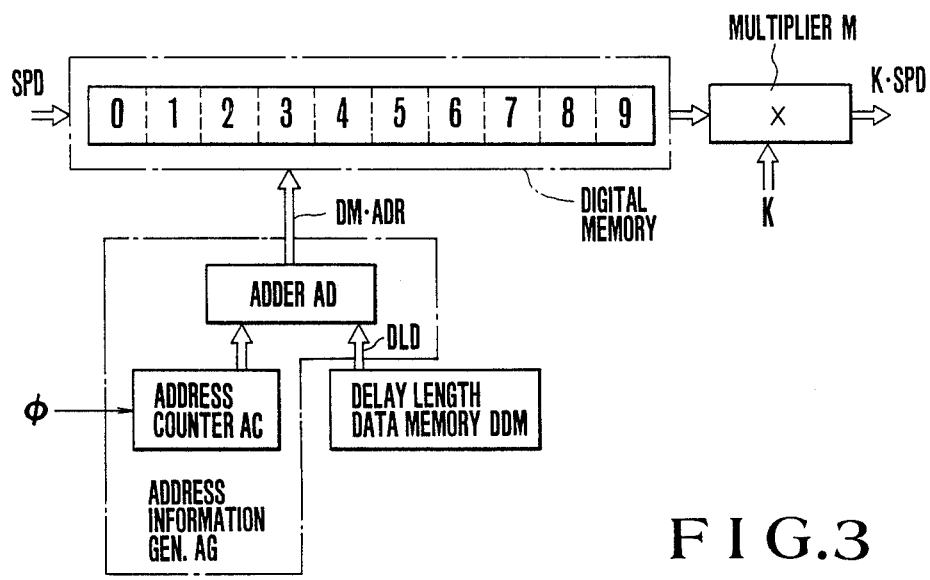
FIGS. 3 and 4 are block diagrams showing basic constructions of two types of delay circuits.

For the sake of description, the basic construction and operation of the delay circuits shown in FIGS. 3 an 4 will be firstly described. Then the process of forming a reverberation tone will be described with reference to the performance block diagram shown in FIG. 2 and finally the preferred embodiment shown in FIG. 1 will be described in detail.

Basic construction of a delay circuit utilizing a digital memory device

Where amplitude data SPD(t) of an input musical tone signal sequentially sampled at a predetermined sampling period $T_o$ are to be sequentially stored in a digital memory device and an amplitude data SPD (t−i) stored at a time (t−i) is to be read out at a time later by an interval i, an address interval $\Delta ADR$ representing a change during the inteval i is added to or subtracted from an address information ADR(t) at a sampling time t according to the following equation (1) or (2) to determine an address information ADR(t-i) at time (t-i), and then the address information ADR(t−i) is applied to the address input of the digital memory device.

$$ADR(t-i) = ADR(t) + \Delta ADR \quad (1)$$

$$ADR(t-i) = ADR(t) - \Delta ADR \quad (2)$$

Thus, the amplitude data SPD(t−i) stored at time (t−i) can be read out at a time later by i expressed by $$i = \Delta ADR \times T_o \quad (3)$$

In other words, where an address interval $\Delta ADR$ corresponding to the desired delay time i is applied as a delay time information it is possible to read out the amplitude data SPD(t−i) stored at the time (t−i) at a time later by the interval i. The equation (1) that determines the address information ADR(t−i) at time (t−i) is applicable to a case where the amplitude data SPD(t) is sequentially stored from a higher order address toward the lower order address as the time elapses. The equation (2) is applicable where the amplitude data SPD(t) is sequentially stored from the lower order address toward the higher order address.

Accordingly, the delay circuit according to this invention comprises, as the fundamental elements, a digital memory device DM sequentially storing the amplitude data SPD(t), an address information generator AG that forms the read address information shown in equation (1) or (2), and a delay length data memory device DDM which generates the address interval $\Delta ADR$ as a delay time information DLD.

FIG. 3 shows one example of the delay circuit based on this concept and constituted by the digital memory device DM, the address information generator AG, a delay length data memory device DDM and a multiplier M.

As shown by the timing chart shown in FIG. 5, the digital memory device DM sequentially stores in its memory areas of addresses 0 through 9 the amplitude data SPD(t) sampled at a predetermined period $T_o$ according to a clock pulse $\phi$ starting from the higher order address 9 toward the lower order address, and is constituted by a random access memory device (RAM) or a shift register.

The designation of the write and read addresses of the amplitude data SPD(t) in the digital memory device DM is effected by the address information generator AG which comprises an address counter AC and an adder AD and forms write address informations ADR(t), ADR(t+1), ADR (t+2), . . . ADR(t+i) whose values are renewed with the sampling time and an read address information ADR(t−i) shown by equation (1) and these write and read address informations are outputted as an address information DM ADR for the digital memory device DM. More particularly the address counter AC counts the number of clock pulses having the period $T_o$ to output its count as the write address information ADR(t) of the amplitude data SPD(t) at the present sampling time, and the information ADR(t) is applied to one input of the adder AD. The delay length data memory device DDM supplies a time information DLD ($\Delta ADR = i/T_o$) corresponding to a desired delay time i to the other input of the adder AD. Then the adder performs an arithmetic operation represented by equation (1) at a given sampling time to output the result of addition as a read address information ADR(t−i) of the amplitude data SPD(t−i) before interval i, and then outputs the output information ADR(t) of the address counter AC as the write address information ADR(t) of the amplitude data SPD (t) at the present time, as it is.

In this manner, at time t, the amplitude data SPD(t−i) which was stored at time (t−i) before an interval i is read out from the digital memory device DM, while the amplitude data SPD(t) at the present time t is stored in the area of the address designated by the address information ADR (t).

The amplitude data SPD(t−i) thus read out from the digital memory device DM later by the interval i is multiplied with a coefficient K for controlling the amplitude level in the multiplier M so that the level of the amplitude data is controlled, and the level-controlled amplitude data K.SPD(t−i) is converted into an analog signal by a digital to analog (D/A) converter not shown. Such operation is performed at each sampling time. As a consequence, a reverberation tone i time later than the input musical tone can be produced. In this case, when a plurality of delay time informations DLD which are different from each other at a sampling time are given sequentially, on the time division basis, a plurality of informations regarding reverberation tones having different delay times at the same sampling time can be produced. Accordingly, in this embodiment, the delay circuit shown in FIG. 3 is utilized to form initial reflected tones having complicated reverberation characteristics whose amplitude level and delay time differ depending upon the difference in the distances to the reflecting members such as surrounding walls.

Figure 4:
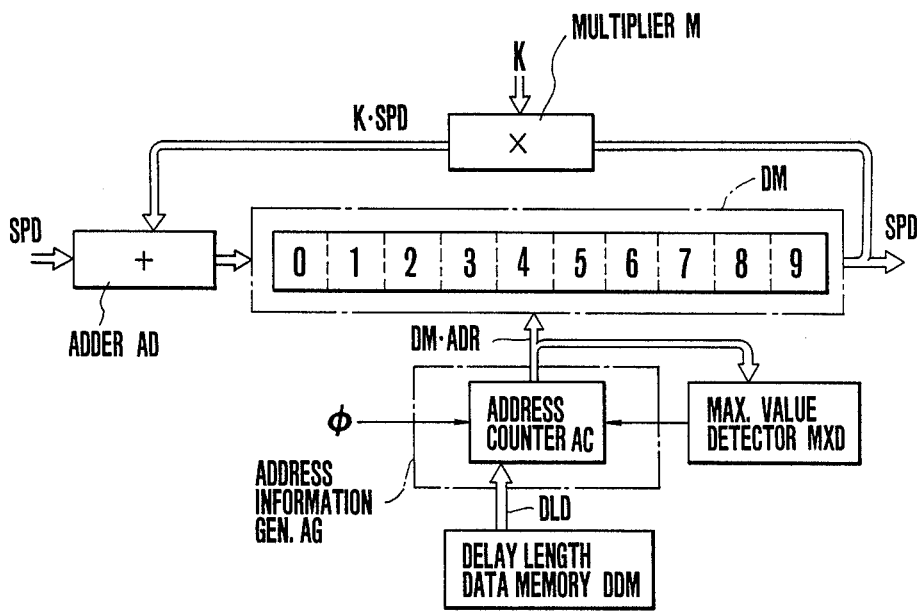

FIG. 4 shows another example of the delay circuit, in which the address counter AC of the address information generator AG is constituted by a preset type down counter. Thus, a delay time information DLD corresponding to a desired delay time i is preset in the address counter AC and the preset value is counted down so as to match the repetition period of the address informtions ADR(t), ADR(t+1) . . . ADR(t+i) outputted from the address counter AC with a delay time designated by the delay time informtion DLD, whereby an amplitude data SPD (t−i) stored before the interval i is read out from an area of an address in which the amplitude data SPD(t) at the present time t is to be stored.

In other words, where the digital memory device DM has 10 words as shown in FIG. 4, the maximum value of the address interval becomes 10 so that it is possible to read out an amplitude data SPD(t−10) delayed a maximum of 10.$T_o$. However, where the desired delay time is made to be 6.$T_o$, for example, an address in which the address data SPD(t) sampled at the present time t is to be written is matched with an address in which an amplitude data SPD (t−i) before the interval i was stored by making the output information DM.ADR outputted from the address counter AC to be a repetition of 5, 4, 3, 2, 1; 5 . . . 0 so as to reduce the range of the addresses utilized in the digital memory device DM, thereby reading out the amplitude data SPD(t−i) written the interval i before from an address in which the amplitude data SPD(t) at the present time is to be written. To this end, in the delay circuit shown in FIG. 4, a maximum value detector MXD is provided for detecting the fact that the output information DM ADR from the address counter AC has changed from 0 to 9 and for presetting the delay time information DLD outputted from the delay length data memory device DDM in the address counter AC.

The delay circuit shown in FIG. 4 is constructed such that instead of storing the amplitude data SPD(t) sampled at the present time t in the digital memory device DM as it is, the amplitude data SPD(t−i) before the interval i is fed back at a predetermined ratio so as to write the sum of the fed back value K.SPD (t−i) and the amplitude data SPD(t) sampled at the present time t. To this end, there are provided a multiplier M which multiplies the amplitude data SPD(t−i) read out from the digital memory device DM before the interval i with a coefficient K and feeds back the multiplied amplitude data to the data input of the digital memory device DM, and an adder AD which adds together the output data K.SPD(t−i) from the multiplier M and the amplitude data SPD (t) at the present time t and supplies the sum [SPD(t)+K SPD(t−i)] to the data input of the digital memory device DM.

Accordingly, with the delay circuit shown in FIG. 4, where the desired delay time i is equal to 6.$T_o$, the address counter AC is preset with a delay time information DLD represented by DLD=6−1=5 at a time when the output information DM.ADR of the address counter AC changes from 0 to the maximum value, in this example 9, whereby the address counter AC repeatedly outputs an address information DM.ADR which varies as 5, 4, 3, 2, 1, 0, 5, . . . 0 as the sampling time proceeds in each sampling period $T_o$. At each sampling time, the amplitude data SPD(t−i) stored before the interval i in the area of the address designated by the address information DM.ADR is firstly read out and then data [SPD(t)+K.SPD(t−j)] formed by adding together at a predetermined ratio the amplitude data SPD(t−i) and the amplitude data SPD(t) sampled at the present time t is written in the area of the address from which the amplitude value SPD (t−i) has been read out.

Accordingly, with the delay circuit shown in FIG. 4, the address in which the amplitude data SPD(t) at the present time t is written and the address from which the amplitude data SPD(t−i) before an interval i is read out are the same, and the amplitude data SPD(t−i) before the interval i is fed back so that it is possible to take out data regarding a reverberation tone whose amplitude value and the delay time vary regularly. Thus, in this embodiment, the delay circuit shown in FIG. 4 is utilized to generate a reverberation tone following an initial reflected tone (echo) and having a regular reverberation characteristic.

When the amplitude data SPD is multiplied with the coefficient K, the data regarding the finally obtained reverberation tone would have a level larger than that of the original amplitude data. Accordingly, in an actual circuit, the data regarding the reverberation tone is applied to the output side terminal through an attenuator. Where the coefficient K is selected such that $-1 < -K < 0$, such attenuator is not necessary.

The process of forming the reverberation tone will now be described with reference to the functional block diagram shown in FIG. 2.

Process of forming the reverberation tone

The process of forming the reverberation tone in the embodiment shown in FIG. 2 comprises the step of forming an initial reflected tone whose amplitude level and delay time vary randomly and the step of forming a reverberation tone whose amplitude level and the delay time vary regularly. In FIG. 2, the initial reflected tone and the reverberation tone are formed by independent delay circuit systems.

In FIG. 2, the amplitude data SPD(t) obtained by sampling an input musical tone signal at a predetermined period $T_o$ is supplied to a first delay circuit system, that is an initial reflected tone forming unit 1, which utilizes the delay circuit shown in FIG. 3 and made up of a memory device D0 having memory addresses for 2048 words, multipliers M1 through M10 respectively multiplying ten types of the amplitude data SPD(t−$i_1$), SPD(t−$i_2$) SPD(t−$i_{10}$) before intervals in (n=1 to 10) which are read out from the memory device D0 at the present sampling time and having different delay times with any amplitude level control coefficient $K_n$(n=1 to 10), and an adder which adds together the outputs $K_1$.SPD(t−$i_1$), $K_2$.SPD (t−$i_2$) . . . $K_{10}$.SPD(t−$i_{10}$) for producing a total sum $$\sum_{n=1}^{10} K_n \cdot SPD(t - i_n)$$

an initial value ECH (t) of the initial reflected tone at the present time t. The adder SUM contains a register R0 which temporarily stores the sum $$\sum_{n=1}^{10} K_n SPD(t - i_n)$$

until the next sampling time (t+1).

In the initial reflected tone forming unit 1 described above, the amplitude data SPD(t) of the input musical tone at the present time t is written in the area of the address corresponding to the present time t among the memory addresses of the memory device D0 for 2048 words. Since the total sum $$\sum_{n=1}^{10} K_n \cdot SPD(t - 1 - i_n)$$

at the previous sampling time (t−1) is stored in the register R0 in the adder SUM, the content of this register R0 would be reset. Then, for the purpose of reading out an amplitude data having a delay time of $i_1$ from the memory device D0 among ten types of the amplitude data $SPD(t-i_1)$ through $SPD(t-i_{10})$ before interval in, an address of the memory device D0 corresponding to the delay time $i_1$ is designated so as to read out from that address the amplitude data $SPD(t-i_1)$ sampled $i_1$ interval before. The address of the area where the amplitude data $SPD(t-i_1)$ $i_1$ interval before is read out is calculated by equation (1).

The amplitude data $SPD(t-i_1)$ thus read out and having a delay time $i_1$ is inputted to the multiplier M1 to be multiplied with an amplitude level control coefficient $K_1$ corresponding to the first reflected tone $ECH_1$ having a delay time $i_1$. The output $K_1 \cdot SPD(t-i_1)$ of the multiplier M1 is supplied to the adder SUM to be added with the present value of the register R0, and the sum is stored again in the register R0. At this time, since the content of the register R0 has been reset immediately after the writing of the amplitude data SPD(t) at the present time t, the data written into the register R0 at this time is the data $K_1 \cdot SPD(t-i_1)$.

As above described, when the processings of reading out the amplitude data $SPD(t-i_1)$ having a delay time of $i_1$ and of the level control are completed, in other words, when the processing regarding the first reflected tone $ECH_1$ is completed, processing of reading out the amplitude data $SPD(t-i_2)$ regarding the second reflected tone $ECH_2$ having a delay time of $i_2$ and of the level control are performed in the same manner as the processing of forming the first reflected tone $ECH_1$. As a consequence, the sum of the data $K_1 \cdot SPD(t-i_1)$ regarding the first reflected tone $ECH_1$ and the data $K_2 \cdot SPD(t-i_2)$ regarding the second reflected tone $ECH_2$, that is $[K_1 \cdot SPD(t-i_1) + K_2 \cdot SPD(t-i_2)]$ is stored in the register R0 in the adder SUM.

Similar processings are also performed for the third reflected tone $ECH_3$ through the tenth reflected tone $ECH_{10}$. As a consequence, the total sum $$\sum_{n=1}^{10} K_n \cdot SPD(t - i_n)$$

of the amplitude data $K_1 \cdot SPD(t-i_1)$ through $K_{10} \cdot SPD(t-i_{10})$ regarding the first reflected tone $ECH_1$ through the tenth reflected tone $ECH_{10}$ would be stored in the register R0, and this total sum $$\sum_{n=0}^{10} K_n \cdot SPD(t - i_n)$$

is outputted through a switch circuit SW as the instantaneous value of the initial reflected tone consisting of the first to 10th reflected tones $ECH_1$ through $ECH_{10}$.

As shown in the following Table I, the switch circuit SW selects the output of the register R0 during an interval Ta in which the initial reflected tone is formed, whereas selects and outputs the output of the second delay circuit system at a time Tb following the forming of the initial reflected tone, the sum of Ta and Tb being sampling period To.

TABLE I

| sampling period To(= Ta + Tb) | |
|---|---|
| Ta | Tb |
| formation of the initial reflected tone | formation of the reverberation tone |

The information ECH(t) selected by the switch circuit SW is converted into an analog signal by a D/A converter, not shown, and then supplied to a loudspeaker to be produced as an initial reflected tone for the input musical tone.

Consequently, by making different the delay times in of the first to 10th reflected tones $ECH_1$ through $ECH_{10}$ and the amplitude level control coefficients $K_n$, it is possible to produce an initial reflected tone whose amplitude level and the delay time vary randomly.

Where the sampling period $T_o$ of the input musical tone is 0.04 ms (25 KHz) and when an amplitude data SPD(t-1626) stored at an address spaced by 1626 words, for example, from the write address for the amplitude data SPD(t) at the present time t is read out, the delay time i becomes $$i = 1626 \times 0.04 \approx 65 \text{ ms}$$

whereby an initial reflected tone delayed about 65 ms from the input musicl tone can be produced.

The amplitude data obtained by sampling the input musical tone at a predetermined period $T_o$ is also supplied to the second delay ciruit system for forming a reverberation tone after forming the initial reflected tone.

This second delay circuit system comprises a delay memory device D10 which supplies to a digital bandpass filter BPF the amplitude data SPD (t) after delaying the same by an interval j, a bandpass filter BPF including a low pass filter LPF and a high pass filter HPF which passes only a predetermined frequency band component of the amplitude data $SPD(t-j)$ delayed by j, a first reverberation tone forming unit 2 of a comb filter and adapted to form a reverberation tone data $RVD^1$ having a coarse delay time spacing based on the amplitude data $SPD(t-j)$ passed through the band pass filter, and a second reverberation tone forming unit 3 having an all pass filter construction and adpted to form a reverberation tone data $RVD^2$ having a short delay time spacing based on the reverberation tone data $RVD^1$.

In the circuit shown in FIG. 2, the amplitude data SPD(t) sampled at the present time t is stored in the area of the address ADR(t) corresponding to the present time t among 2048 memory addresses of the memory device D10. For the purpose of reading out an amplitude data $SPD(t-j)$ sampled before an interval j among a number of amplitude data SPD(t) stored in the memory device 10, an address of the memory device D10 corresponding to the delay time j is designated. The address of the area where the amplitude data $SPD(t-j)$ sampled an interval j before is read out is determined by equation (1) in the case of forming the initial reflected tone. The delay time j at this time is selected to be slightly larger than the delay time $i_{10}$ regarding the tenth reflected tone $ECH_{10}$, that is $j > i_{10}$.

The amplitude data $SPD(t-j)$ having the delay time j thus read out of the memory device D10 is inputted to the multiplier M11 of the low pass filter LPF to be multiplied with a predetermined coefficient $K_{11}$, and the product $K_{11} \cdot SPD(t-j)$ is temporarily stored in the register R1. Then, an amplitude data $SPD(t-j-1)$ written one sampling time ($1 \cdot T_o$) before is read out from the memory device SD0 having memory area of one word and then multiplied with a predetermined coefficient $K_{12}$ in the multiplier M12. Then, the output $K_{12} \cdot SPD(t-j-1)$ of the multiplier M12 and the amplitude data $K_{11}.SPD(t-j)$ before interval j temporarily stored in the register R1 are added together. The sum $[K_{12}.SPD(t-j-1)+K_{11}.SPD(t-j)]$ is again temporarily stored in the register R1 and the register R2. Then, the amplitude data $SPD(t-j-1)$ written at a time one sampling time $(1.T_o)$ before the present time t is again read out from the memory device SD and then multiplied with a predetermined coefficient $K_{13}$ in the multiplier M13. The product $K_{13}.SPD(t-j-1)$ thus formed is added to a value $[K_{12}.SPD(t-j-1)]$ temporarily stored in the register R2 and the sum $[K_{12}.SPD(t-j-1)+K_{11}.SPD(t-j)+K_{13}.SPD(t-j-1)]$ is again temporarily stored in the register R2. For the purpose of utilizing the value $[K_{12}.SPD(t-j-1)+K_{11}.SPD(t-j)]$ temporarily stored in the register R1 in the next sampling period $(t+1)$, this value is stored in the memory device SDO.

By performing these operations at each sampling period $T_o$ an amplitude data $SPD(t-j)$ before time j and removed with high frequency components in a predetermined bandwidth is outputted from the register R2 of the low pass filter LPF and sent to the high pass filter HPF.

Then the high pass filter HPF removes low frequency components in a predetermined bandwidth from the amplitude data $SPD(t-j)$ before interval j in the same manner as in the low pass filter.

Then, the output data $SPD(t-j)$ of the register R2 of the low pass filter LPF is supplied to the multiplier M14 to be multiplied with a predetermined coefficient $K_{14}$, and the product $K_{14}.SPD(t-j)$ is temporarily stored in the register R3. Then the amplitude data $SPD(t-j-1)$ written one sampling time $(1.T_o)$ before is read out from the memory device SD1 having memory area of a single word and multiplied with a predetermined coefficient $K_{15}$ in the multiplier M15. The product $K_{15}.SPD(t-j-1)$ thus obtained is added to the amplitude data $K_{14}.SPD(t-j)$ before time j and has been temporarily stored in the register K3 and the sum $[K_{14}.SPD(t-j)+K_{15}.SPD(t-j-1)]$ is temporarily stored in the registers R3 and R4. The amplitude data $SPD(t-j-1)$ written at a time before one sampling time $(1.T_o)$ than the present time t is again read out from the memory device SD1 and multiplied with a predetermined coefficient $K_{16}$ in the multiplier M16 and the product $K_{16}.SPD(t-j-1)$ is added to $[K_{14}.SPD(t-j)+K_{15}.SPD(t-j-1)]$ stored temporarily in the register R4 and the sum $[K_{16}.SPD(t-j-1)+K_{14}.SPD(t-j)+K_{15}.SPD(t-j-1)]$ is temporarily stored in the register R4. For the purpose of using the value $[K_{14}.SPD(t-j)+K_{15}.SPD(t-j-1)]$ temporarily stored in the register R3 in the next sampling period $(t+1)$, this value is written into the memory device SD1.

These operations are performed in each sampling period $T_o$ so as to produce the amplitude data $SPD(t-j)$ before time j and removed with low frequency components in a predetermined bandwidth from the register R4 of the high pass filter HPF.

Since the register R1 of the low pass filter LPF is not utilized until the next sampling period after writing its content into the memory device SD0, the register R3 of the high pass filter HPF can be used as the register R1.

The amplitude data $SPD(t-j)$ before the interval j and removed with the low and high frequency components in a predetermined bandwidth is inputted to the first reverberation tone forming unit 2.

The first reverberation tone forming unit 2 is provided with three parallelly connected delay circuits 2A, 2B and 2C of the comb filter construction. With a single delay circuit of the comb filter construction the frequency characteristic becomes wavy as shown by A, B and C in FIG. 7 so that three delay circuits 2A, 2B and 2C are connected in parallel. More particularly, parallel connection of three delay circuits 2A, 2B and 2C having different delay times flattens the overall frequency characteristic as shown by D in FIG. 7. The degree of flatness can be improved as the number of parallelly connected delay circuits increase.

In this embodiment, the delay circuit 2A has the longest delay time, the delay circuit 2B has the next delay time, and the delay circuit 2C has the shortest delay time. Although delay circuits 2A, 2B and 2C have different delay times they have the same construction. Accordingly, the construction of only the delay circuit 2A is shown in detail, but delay circuits 2B and 2C are shown only with the reference charactors of their multipliers registers and memory devices.

In the first reverberation tone forming unit 2 described above, the amplitude data $SPD(t-j)$ before time j and passed through the bandpass filter BPF is multiplied with an amplitude level control coefficient $K_{17}$ in a multiplier $K_{17}$. The product $K_{17}.SPD(t-j)$ thus produced is temporarily stored in a register R5 in the multiplier M17. For the purpose of reading out amplitude data $SPD(t-x_1)$ written in a memory device D1 having memory addresses for 2048 words $x_1$ time before, an address of the memory device D1 corresponding to the delay time $x_1$ is designated. The read out amplitude data $SPD(t-x_1)$ is applied to an adder SUM where it is added to the outputs of other memory devices D2 and D3 and to the outputs of the memory devices D4 through D6 and D7 through D9 of the delay circuits 2B and 2C, and the sum is temporarily stored in a register R11 in the adder SUM. In this case, the reading operations of the memory devices D1 through D9 are sequentially performed on the time division bases in the order of from D1 to D9. Accordingly, during the reading of the memory device D1, no data is outputted from other memory devices D2 through D9. As a consequence, the data written into the register R11 in the adder SUM is the data $SPD(t-x_1)$ read out from the memory device D1.

The amplitude data $SPD(t-x_1)$ read out from the memory device D1 is multiplied with an amplitude level control coefficient $K_{13}$ in a multiplier 18 and then fed back to the input side of the memory device D1. The product $K_{13}.SPD(t-x_1)$ is added to data $K_{17}.SPD(t-j)$ temporarily stored in the register R5 at the present time t and the sum $[K_{17}.SPD(t-j)+K_{18}.(t-x_1)]$ in temporarilly stored in a register R6. Then the amplitude data $[K_{17}.SPD(t-j)+K_{18}.SPD(t-x_1)]$ stored in the register R6 is written into the same address which is storing the amplitude data $SPD(t-x_1)$ before time $x_1$. Thereafter, the content of the register R6 is reset. The reason for resetting the register R6 is to use this register for the processing of the system including the memory device D2 in the next stage.

Upon completion of the processing of the system including the memory device D1, the processing of the system including the memory device D2 is executed in the same manner.

More particularly, for the purpose of reading out the amplitude data $SPD(t-x_2)$ written $x_2$ time before, into the memory device D2 having 2048 word addresses an address of the memory device D2 corresponding to the delay time $x_2$ is designated, thereby to read out the amplitude data $SPD(t-x_2)$ sampled $x_2$ time before from the memory device D2. This read out amplitude data $SPD(t-x_2)$ is added to the content $SPD(t-x_1)$ of a register R11 (the content read out from the memory device D1) by the adder SUM and the sum $[SPD(t-x_1)+SPD(t-x_2)]$ is temporarily stored in the register R11.

The amplitude data $SPD(t-x_2)$ read out from the memory section D2 is multiplied with an amplitude level control coefficient $K_{18}$ in a multiplier 19 and then fed back to the input side of the memory device D2. The product $K_{19}\cdot SPD(t-x_2)$ is added to the value $K_{17}\cdot SPD(t-j)$ temporarily stored in a register R5, and the sum $[K_{17}\cdot SPD(t-j)+K_{19}\cdot SPD(t-x_2)]$ is temporarily stored in a register R6. The data $[K_{17}\cdot SPD(t-j)+K_{19}\cdot SPD(t-x_2)]$ to be stored in the register R6 is stored in the same address storing the data $SPD(t-x_2)$, $x_2$ time before. Thereafter, the content of the register R6 is reset.

Thereafter, the processing of the system including the memory section D3 is executed in the same manner as that of the system including the memory device D2.

Denoting the delay time of the system including the memory device D3 by $x_3$, at the time of completing the processings of the systems including memory sections D1, D2 and D3, the data to be stored in the register R11 is expressed by $$SPD(t-x_1)+SPD(t-x_2)+SPD(t-x_3)$$

whereas the data to be stored in the memory device D3 is expressed by $$K_{17}\cdot SPD(t-j)+K_{20}\cdot SPD(t-x_3)$$

Similar processings are executed in the delay circuits 2B and 2C.

Denoting the delay times of the systems including memory sections D4, D5 and D6 of the delay circuit 2B by $x_4$, $x_5$ and $x_6$ respectively, and the delay times of the systems including memory sections D7, D8 and D9 of the delay circuit 2C by $x_7$, $x_8$ and $x_9$ respectively, then the content of the register 11 at the time when all processings of the delay circuits 2A, 2B and 2C have completed is expressed by the following equation $$RVD^1 = \sum_{n=1}^{9} SPD(t-x_n)$$
$$= SPD(t-x_1) + SPD(t-x_2) + SPD(t-x_3) +$$
$$SPD(t-x_4) + SPD(t-x_5) + SPD(t-x_6) +$$
$$SPD(t-x_7) + SPD(t-x_8) + SPD(t-x_9)$$

Figure 8:
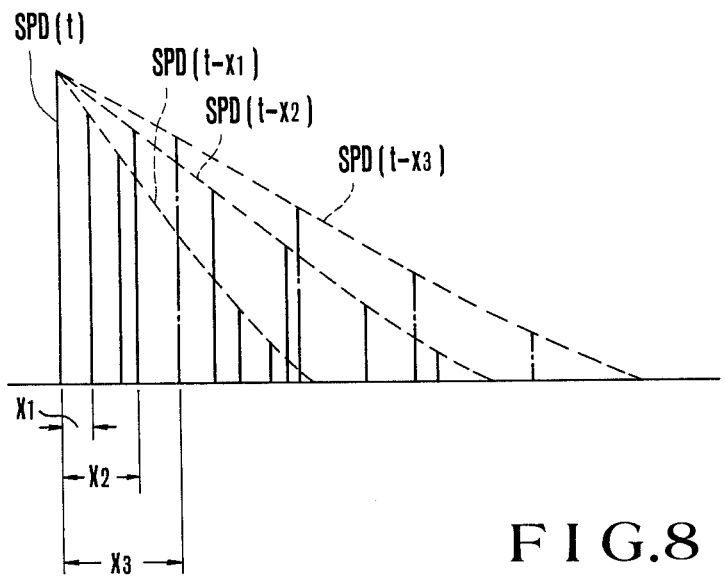
FIGS. 8 and 9 are graphs showing the characteristics of reverberation tones generated in the embodiment shown in FIG. 1.

Consequently, following the initial reflected tone, a reverberation tone can be obtained having a long delay time and in which the amplitude level and the delay time vary regularly as shown in FIG. 8, in which the reverberation tone of the delay circuit 2A alone is depicted for the sake of simplicity.

The reverberation tone data $RVD^1$ thus formed and having a long delay time interval is supplied to the second reverberation tone forming unit 3.

The second reverberation tone forming unit 3 is provided with serially connected delay circuits 3A, 3B and 3C of the all pass type filter construction having a flat frequency characteristic.

The three delay circuits 3A, 3B and 3C are connected in series to form a reverberation tone data $RVD^2$ having a shorter delay time interval than the reverberation tone data $RVD^1$ formed by the first reverberation tone forming unit 2. For ths reason, the delay times of the delay circuits 3A, 3B and 3C of the second reverberation tone forming unit 3 are set to be shorter than the delay times of the delay circuits 2A, 2B and 2C of the first reverberation tone forming unit 2. The delay circuits 3A, 3B and 3C are set with different delay times but have the same construction. Accordingly, the construction of only the delay circuit 3A is shown in detail but delay circuits 3B and 3C are shown with the reference charactors of their multipliers, registers and memory devices.

The reverberation tone data $RVD^1$ outputted from the second reverberation tone forming unit 2 is supplied to a register R12 of the delay circuit 3A, but prior to store this data $RVD^1$ in the register R12, for the purpose of reading out $y_1$ time before data $RVD^1(t-y_1)$ written into a memory section MD0 having 512 word memory addresses, an address of the memory device MD0 corresponding to the delay time $y_1$ is designated, thus reading out the data $RVD^1(t-y_1)$ from the memory device MD0 written before the time $y_1$. The data $RVD^1(t-y_1)$ is multiplied with an amplitude level control coefficient $K_{30}$ in a multiplier M30, and the product $K_{30}\cdot RVD^1(t-y_1)$ is fed back to the input side of the memory section MD0. Then the fed back data $K_{30}\cdot RVD^1(t-y_1)$ is added to data $RVD^1(t)$ supplied from the first reverberation tone forming unit 2 at the present time and the sum $[RVD^1(t)+K_{30}\cdot RVD^1(t-y_1)]$ is temporarily stored in the register R12. Thereafter, the address of the memory section MD0 corresponding to the delay time $y_1$ is designated again and the data $RVD^1(t-y_1)$ written $y_1$ time before is again read out from the memory section MD0. The read out data $RVD^1(t-y_1)$ is temporarily stored in the register R13. Then the data $[RVD^1(t)+K_{30}\cdot RVD^1(t-y_1)]$ temporarily stored in register R12 is multiplied with an amplitude control coefficient $K_{20}$ in a multiplier 29 and the product $K_{29}\cdot[RVD^1(t)+K_{30}\cdot RVD^1(t-y_1)]$ is added to a value $RVD^1(t-y_1)$ temporarily stored in the register R13. The sum $RVD^1(t-y_1)+K_{29}\cdot[RVD^1(t)+K_{30}\cdot RVD^1(t-y_1)]$ is temporarily stored in the register R13. For the purpose of utilizing the data $[RVD(t)+K_{30}\cdot RVD^1(t-y_1)]$ temporarily stored in the register R12 at a sampling time $(t+y_1)$ later than the present time t by an interval $y_1$, the data $[RVD^1(t)+K_{30}\cdot RVD^1(t-y_1)]$ is stored in the address in which the data $RVD^1(t-y_1)$ was stored.

When the processing executed by the delay circuit 3A is completed, the data $RVD^1(t-y_1)+K_{29}[RVD^1(t)+K_{30}\cdot RVD^1(t-y_1)]$ is sent to the delay circuit 3B in which this data is processed in the same manner as in the delay circuit 3A.

Denoting the output data from the delay circuits 3A, 3B and 3C by $RVD^{2A}$, $RVD^{2B}$ and $RVD^{2C}$ respectively and denoting the delay time of the delay circuit 3B by $y_2$, and the delay time of the delay circuit 3C by $y_3$, then the output data of the registers R13, R15 and R17 of the delay circuits 3A, 3B and 3C can be expressed by the following equations (4), (5) and (6).

$$RVD^{2A}=RVD^1(t-y_1)+K_{29}\cdot[RVD^1(t)+K_{30}\cdot RVD^1(t-y_1)] \qquad (4)$$

$$RVD^{2B}=RVD^{2A}(t-y_2)+K_{31}\cdot[RVD^{2A}(t)+K_{32}\cdot RVD^{2A}(t\text{-}31\ y_2)] \qquad (5)$$

$$RVD^{2C} = RVD^{2B}(t-y_3) + K_{32} \cdot [RVD^{2B}(t) + K_{34} \cdot RVD^{2B}(t-y_3)] \quad (6)$$

Figure 9:
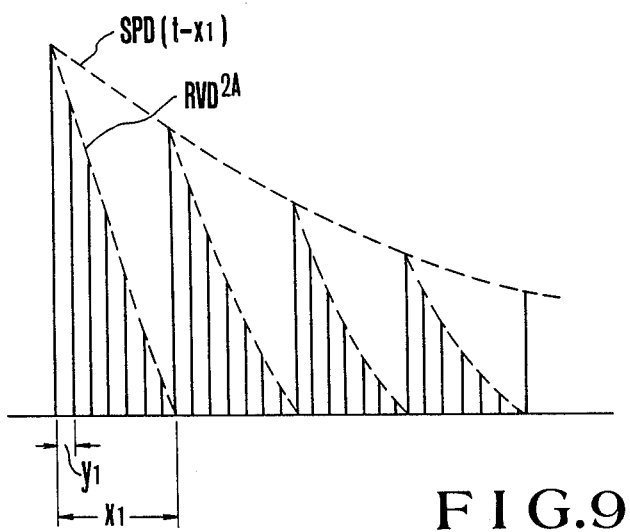
Figure 10:
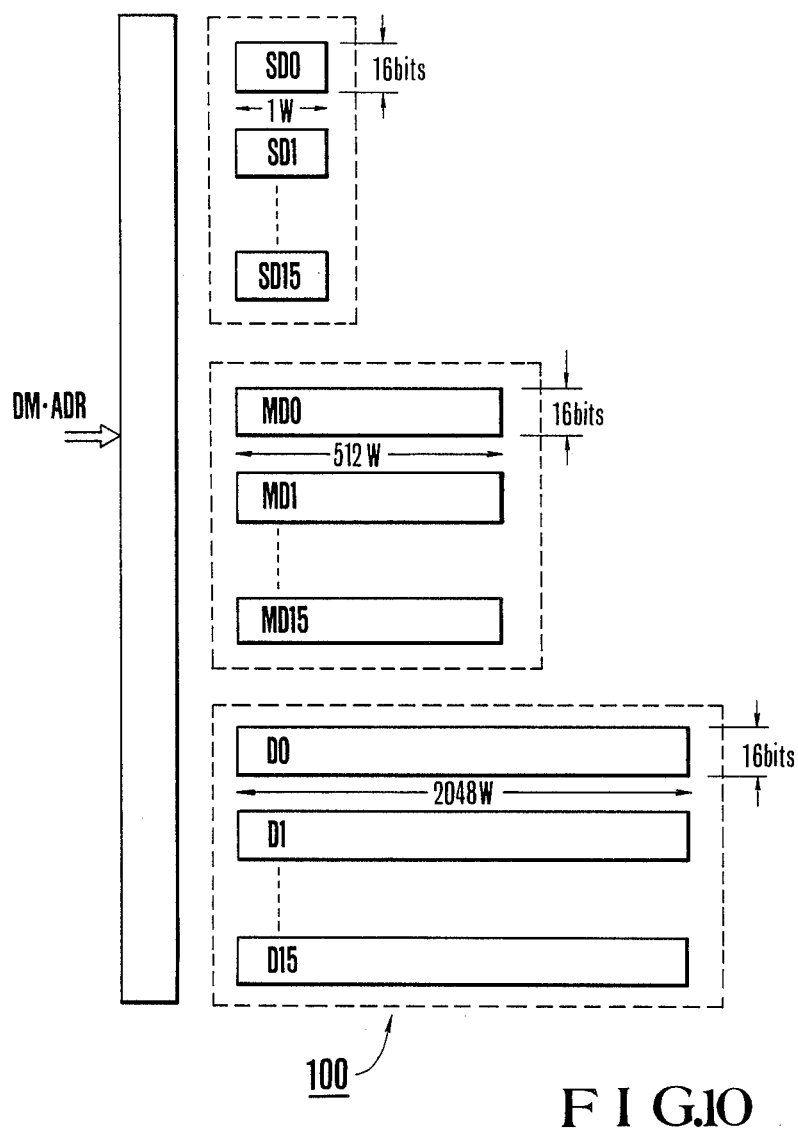
FIG. 10 is a block diagram showing the construction of a data memory device utilized in the embodiment shown in FIG. 1.

The output data $RVD^{2C}$ of the delay circuit 3C is outputted via a switch circuit SW as data for producing a reverberation tone following the initial reflected tone.

Where the relation among the delay times of the delay circuits 3A, 3B and 3C is selected as $y_1 > y_2 > y_3$ it is possible to form a reverberation tone having a short delay time spacing as shown in FIG. 9. More particularly, based on the reverberation tone data $RVD^1$ formed by the first reverberation tone forming unit 2 and having a long delay time spacing, the delay circuit 3A forms a first reverberation tone data $RVD^{2A}$ having a spacing shorter than the delay timne spacing of the first reverberation tone forming unit 2, while the delay circuit 3B forms a second reverberation tone data $RVD^{2B}$ having a spacing $y_2$ shorter than the delay time spacing $y_1$ of the delay circuit 3A. For this reason, as the forming processings of the reverberation tones by the delay circuits 3A, 3B and 3C proceed, reverberation tones having shorter delay time spacings would be formed.

Since the registers R12, R14 and R16 in the delay circuits 3A, 3B and 3C are not used until the next sampling period, once the processing executed by them are completed they can be used commonly on the time division basis.

Obviously, in the delay circuits 3A, 3B and 3C, the multiplier M29 may directly receive the data RVD' or the output of the first reverberation forming unit 2 as shown at dotted line and similarly, the multiplier M30 may be connected to receive the output of the register R13.

The detail of the construction and operation of the embodiment shown in FIG. 1 will now be described. In the following description, it is assumed that the circuit shown in FIG. 1 forms the reverberation tone according to the performances described in connection with FIG. 2.

Detailed Construction of one embodiment

The reverberation tone generating apparatus of the embodiment shown in FIG. 1 generally comprises a memory unit 10, a time information generator 20, an address information generator 30 and a calculating unit 40.

The memory unit 10 corresponds to the delay digital memory device DM shown in FIG. 4 and constituted by a data memory device 100 having a plurality of memory blocks and a latch circuit 101. By utilizing the plurality of memory blocks there are formed memory sections SD0 through SD15 each for one word (16 bits), memory sections MD0 through MD15 for 512 words (each 16 bits), and memory sections D0 through D15 for 2048 words (each 16 bits). The data to be stored in these memory sections SD0 through Sd15, MD0 through MD15 and D0 through D15 are given from the calculating unit 40, and a data storing address and a data read out address are designated by address informations DM.ADR outputted from an address information generator 30. Data read out from respective memory sections SD0 through SD15 are supplied to the calculating unit 40 via the latch circuit 101.

Figure 11:
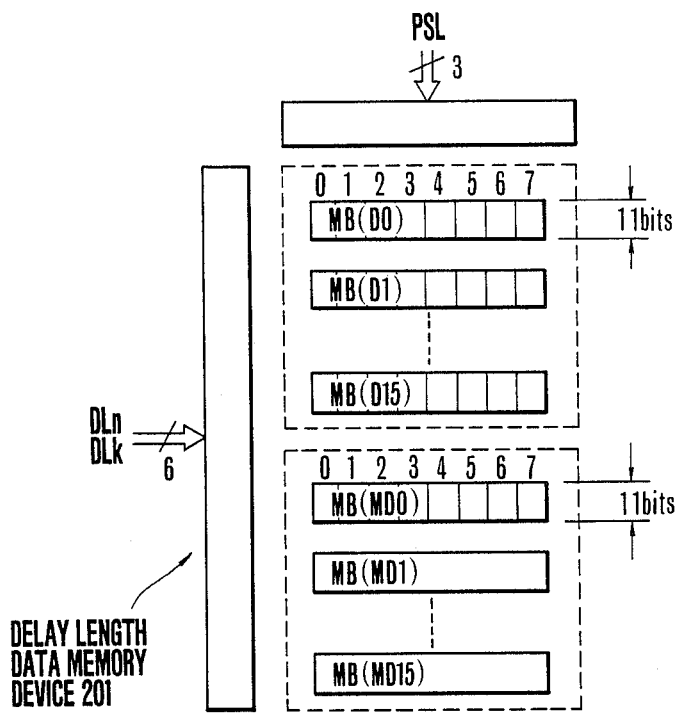
FIG. 11 is a block diagram showing the construction of a delay length data memory device utilized in the embodiment shown in FIG. 1.

The time information generator 20 corresponds to the delay length data memory device DDM and comprises a parameter designating circuit 200 and a delay length data memory device 201. The delay length data memory device 201 is constructed to select and output either one of the delay time informations $DLD^m(n)$ (where n designates memory sections D0 through D15 and MD0 through MD15, and m designates types 1 through 8) relating to respective data delay memory sections D0 through D15 and MD0 through MD15 respectively corresponding to 8 types of the reverberation tones (including the initial reflected tone) having different reverberation characteristics in accordance with a designation from the parameter designating circuit 200. More partcularly, as shown in FIG. 11, the delay length data memory device 201 comprises memory blocks MB(D0) through MB(D15); MB(MD0) through MB(MD15) respectively corresponding to the data delay memory sections D0 through D15 and MD0 through MDL15. Each of the memory blocks MB(D0) through MB(MD15) comprises 8 memory addresses 0 through 7 corresponding to the 8 types of the reverberation tones. Respective memory addresses 0 through 7 of the memory blocks MB(D0) through MB(MD15) pre-store different ones of the delay time informations $DLD^1(D0)$ through $DLD^8(D0)$, $DLD^1(D1)$ through $DLD^8(D1)$ ... $DLD^1(D15)$ through $DLD^3(D15)$, $DLD^1(MD0)$ through $DLD^8(MD0)$, ... $DLD^1(MD15)$ through $DLD^8(MD15)$. 3 bit parameter designation information PSL designating the reverberation tone characteristic of a reverberation tone to be generated is supplied from the parameter designating circuit 200 as a lower order address information when a bit memory number information $DLn(n=0$ through 15) that designate one of the memory numbers 0 through 15 of the memory secions MD0 through MD15 and a 2 bit memory type information DLK (k=D, MD, SD) that designates the type D, MD and SD of the memory sections are supplied from the address information generator 30 as upper order address informations, the delay time information $DLD^m(n)$ which has been stored in a memory address (one of 0 through n) designated by the information DSL in a memory block (one of MB(DO) through MB(MD15) designated by the informations DLn and DLk is read out and supplied to the address information generator 30 as an information that determines the delay time relation of a reverberation tone having a desired reverberation characteristic designated by the parameter designating circuit 200. The delay time of the memory sections SD0 through Sd15 is fixed to $1.T_o$, so that any delay time information is not necessary for these memory sections SD0 through Sd15. In addition to the parameter designation information PSL, the parameter designating circuit 200 produces a 3 bit program selection information PGS that selects desired one of the control programs prepared for forming 8 types of the reverberation tones.

Based on the delay time information $DLD^m(n)$ and the program selection information PGS outputted from the time information generator 20 and a master clock pulse $\phi_o$ that determines the one step period of the control program, the address information generator 30 produces an address information DM ADR for the data memory device 100 necessary to form a reverberation tone of a desired reverberation characteristic and various control signals for controlling the operations of various circuits. The address information generator 30 comprises a program memory device 300, a program counter 301, a program decoding memory device 302, a control signal output register 303, a selector 304, an address counter 305, a latch circuit 306, a subtractor 307, a maximum value detector 308 and an address information output circuit 309.

8 types of the control programs are prestored in the program memory device 300 for forming 8 types of reverberation tones having different reverberation characteristics, and which one of the control programs is to be outputted is designated by a program selection information PGS outputted from the parameter designation circuit 200. The content of the designated program is sequentially read out at each step by the output information PC of the program counter 301 which counts the number of the master clock pulses $\phi_o$.

In order to complete in one sampling period $T_o$ all processings of the initial reflected tone forming unit 1, the bandpass filter BPF, the first reverberation tone forming unit 2 and the second reverberation tone forming unit 3, when the sampling frequency is selected to be 25 KHz, and the frequency of the master clock pulse $\phi_o$ to be 4.8 MHz, then the number of steps of one control program becomes less than 4800/25 = 192 and the content of the control program having 192 steps is executed at each sampling period $T_o$. As shown in the following Table II, as the control programs at respective steps, three types of contents are prepared, that is first, second and third types in which one step is constituted by a 16 bit information. The forming of the initial reflected tone, filter processing and the forming of the reverberation tone are implemented by approximately combining the sequence of these three type control programs and the contents of each bit information.

TABLE II

| Bit | Type 1 | Type 2 | Type 3 |
|---|---|---|---|
| B00 | read address | register number | offset address |
| 01 | information of | designation | information of |
| 02 | coefficient Ki | information | OF · ADRn |
| 03 | ADR(Kn) (6 bits) | RGn (5 bits) | DO |
| 04 | | "0" = initia | |
| 05 | | SL0 reflected tone | |
| | | "1" = reververation tone | |
| 06 | designation | designation | |
| 07 | information | information DLn | |
| 08 | DLn(6 bits) | (6 bits) of | |
| 09 | of delay circuit | delay circuit | |
| 10 | control | control | control |
| 11 | information | information | information |
| 12 | OPC (4 bits) | OPC (4 bits) | OPC (5 bits) |
| 13 | | | |
| 14 | | | |
| B15 | | | |

In this example, the one step control programs each consisting of 16 bits can be classified into two types, one outputted through the control signal output register 303 as they are as informations OF.ADRn, RGn, DLn, and ADR(kn) and the other outputted through the control signal output register after being decoded by the program decoding memory device 302 as the memory write control signal WR1, the latter type signal being applied to the program decoding memory device 302 from the program memory device 300 to act as an operation code OPC. The content of Table II will be described later in detail together with the operation.

Figure 12:
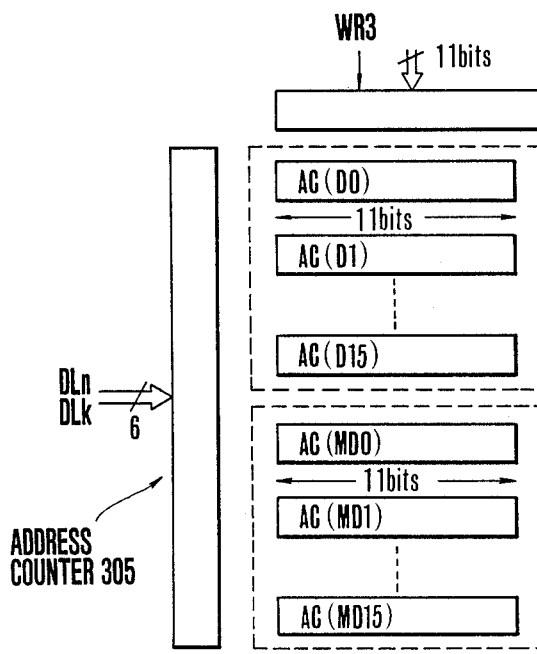
FIG. 12 is a block diagram showing the construction of the address counter utilized in the embodiment shown in FIG. 1.

As shown in FIG. 12, the address counter 305 comprises address counters AC(D0) through AC(D15), AC(MD0) through AC(MD15) respectively corresponding to delay memory sections D0 through D15, MD0 through MD15. Respective counters AC(D0) through AC(D15) and AC(MD0) through AC(MD15) of the address counter 305 are selectively actuated by a memory number information DLn and a memory type information DLk. The count output informations ADR(n) of the address counters AC(n)(n: D0 through D15, MD0 through MD15) which are actuated by informations DLn and DLk are supplied to the address information output circuit 309 through the latch circuit 306 and also to the subtractor 307. In this example, the output informations ADR(n) of the address counters AC(n) is constituted by 11 bits so that they can designate an address range up to 2048 words, because memory sections D0 through D15 among the memory sections D0 through D15 and MD0 through MD15 are constructed to have an address information length of 2048 words. The address counter 305 is constituted by a RAM.

The subtractor 307 subtracts [1] from the output content ADR(n) of the address counters AC(n) inputted via the latch circuit 306 and feeds back the difference [ADR(n) − 1] to the A input of the selector 304 for the purpose of using the difference in the next sampling period (t + 1). At the same time, the difference is also supplied to the maximum detection circuit 308 which corresponds to the detector MXD shown in FIG. 4. When the maximum value detection circuit 308 detects the fact that an information [ADR(n) − 1] obtained by subtracting [1] from the output information ADR(n) of the address counter AC(n) designated by the memory number information DLn and the memory type information DLk has reached the maximum value (all bits are "1"), the maximum value detection circuit 308 applies a selection control signal SLB to the selector 304 causing the same to select the input B. The output information [ADR(n) − 1] of the subtractor 307 is inputted to the input A of the selector 304, and the output information DLD$^m$ (n) of the delay length data memory data memory device 201 is inputted to the input B of the selector 304 so that its output is supplied to one input of the address counter 305 so as to be written (preset) in an address counter AC(n) designated by informations DLn and DLK in accordance with a write control signal WR3. Consequently, under a condition in which the maximum value detection circuit 308 does not produce any selection control signal SLB, a value [ADR(n) − 1] obtained by subtracting [1] from the present value ADR(n) would be written in the address counter AC(n) designated by informations DLn and DLk, at each sampling period, so that the output information ADR(n) of the address counter AC(n) decreases toward zero as the time elapses. However, when the value [ADR(n) − 1] reaches the maximum value, the maximum value detection circuit 308 produces a selection control signal so that a delay time information DLD$^m$ (n) is applied to the address counter AC(n) via the selector 304 and written into the address counter AC(n) in accordance with the write control signal WR3. Consequently when the selector control signal SLB is generated, the content of the address counter AC(n) becomes DLD$^m$ (n) and then sequentially changes toward zero as the sampling time elapses. In other words, in a portion constituted by a selector 304, an address counter 305, the latch circuit 306, the subtractor 307 and the maximum value detection circuit 308, the address counter AC(n) designated by the informations DLn and DLk forms an address information ADR(n) that completes one cycle with a period equal to a delay time corresponding to the delay time information DLD$^m$ (n). The address information ADR(n) is supplied to the address information output circuit 309.

The purpose of the address information output circuit 309 is to output address informations for reading out and writing informations into the memory sections SD0 through SD15, D0 through D15 and MD0 through MD15. Where an information delayed by an interval in is read out from the memory section D0 to form an initial reflected tone ECH(t), the address information output circuit 309 formes one set of informations OF.ADRn, DLn, and DLk and outputs this set as an address information DM.ADR by utilizing an 11 bit address information OF.ADRn corresponding to respective delay times in of the first to 10th reflected tones $ECH_1$ through $ECH_{10}$ (outputted by the control signal output register 303) as a lower order address information and then adding a memory number information DLn and a memory type information DLk. Where an amplitude data SPD(t) sampled at the present time is to be written into the memory section D0, the address information output circuit 309 outputs a set of informations ADR(D0), DLn and DLk as an address information DM.ADR, the set being formed by utilizing the output information ADR(D0) of the address counter AC(D0) corresponding to the memory section D0 as a lower order address information and then adding informations DLn(=DL0) and DLk(=DL0) that designate the memory section $D_o$ to the upper order. When an amplitude data is written into and read out from the memory sections SD0 through SD15, all bits of a lower order address information are made "0" and informations DLn(=$DL_0$ to $DL_{25}$) and DLk (=$DL_{SD}$) designating memory sections SD0 through SD15 are added to an upper order to form and output an address information DM.ADR. Where reverberation tones $RVD^1$ and $RVD^2$ are to be formed, the output informations ADR(D1) through ADR(D15) and ADR(MD0) through ADR(MD15) of respective address counters AC(D1) through AC(D15) and AC(MD0) through AC(MD15) respectively corresponding to memory sections D1 through D15 and MD0 through MD15 are utilized as the lower order informations and informations DLn and DLk are added to their upper orders. These one set of informations ADR(n), DLn and DLk are outputted as an address information DM.ADR. In this case, at a time when the information OF.ADRn is to be added to the lower orders of the information DLn and DLk, the control signal output register 303 outputs a control pulse GP1. When all bits of the lower address information to be added to the lower orders of the informations DLn and DLk are to be made to "0", the control signal output register 303 produces a control pulse GP2. The address information output circuit 309 contains therein a register that temporarily stores informations DLn and DLk.

The purpose of the calculating unit 40 is to effect amplitude level control of the data to be stored in memory sections D0 through D15, MD0 through MD15 and SD0 through SD15 and of the data read out from respective memory sections. The calculating unit 40 comprises a coefficient memory device 400, a selector 401, a calculating or operation circuit 402, a temporary register 403 and a latch circuit 404.

Similar to the delay length data memory device, the coefficient memory device 400 includes 8 memory blocks corresponding to 8 types of the reverberation tones having different reverberation characteristics and respective memory blocks prestore a set of coefficients Kn (n=1 to 32) necessary to form reverberation tones of different types. When supplied with a parameter designation information PSL from the parameter designation circuit 200, and an address information ADR(Kn) designating the coefficient Kn, among the memory blocks designated by the information PSL, a coefficient Kn is read out from an address designated by the information ADR(Kn) and supplied to an input A of the calculating circuit 402.

The amplitude data SPD(t) of the input musical tone sampled by a sample and hold circuit SPH is inputted to the input A of the selector 401 data MRD read out from the memory device 10 is inputted to the input B and the output data RGD of the temporary register 403 is supplied to the input C via the latch circuit 404. Either one of these input data SPD(t), MRD and RGD is selected by a selection control signal SL1 (2 bits) and then applied to the input X of the calculating circuit 402.

A coefficient Kn read out from the coefficient memory device 400 is applied to the input A of the calculating circuit 402, and the output data RGD from the temporary register 403 is inputted to the input B through the latch curcuit 404 and data SPD(t), MRD, RGD selected by the selector 401 are applied to the input X so that the calculating circuit 402 performs the following calculations in accordance with a calculation control signal CTL (3 bits) outputted from the control signal output registre 303.

$$(Y)=(A)\cdot(X)+(B) \qquad (7\text{-}1)$$

$$(Y)=(X)+(B) \qquad (7\text{-}2)$$

$$(Y)=(X) \qquad (7\text{-}3)$$

$$(Y)=(B) \qquad (7\text{-}4)$$

$$(Y)=(0) \qquad (7\text{-}5)$$

The results (Y) of calculations are supplied to the temporary register 403, the memory device 10 and the output register 500.

The temporary register 403 temporarily stores the values calculated by the calculating circuit 402 while the initial reflected tone ECH(t) and the reverberation tones $RVD^1$ and $RVD^2$ are being formed, and feeds back its content to the input C of the selector 401 and the input B of the calculating circuit 402 to act as the register output data RGD. The temporary resistor 403 has 32 registers R0 through R31 designated by register designation informations RGn (n=1 to 32) of a 5 bit construction and the input data are written into registers R0 through R31 designated by the informations RGn under the control of the write control signal WR1

The output register 500 stores the instantaneous value ECH(t) of the initial reflected tone obtained as a value Y calculated by the calculating circuit 402 and the instantaneous value RVD(t) of a reverberation tone following the initial reflected tone under the control of a control signal WR2 and supplies the data thus stored to a D/A converter 502 via an attenuator 501.

The selection control signal SL1 applied to the calculation control signal CTL applied to the calculation circuit 402 are contained in an operation code OPC outputted from the control signal output register 303.

The reverberation tone generating apparatus described above operates as follows.

Operation

(a) Formation of the initial reflected tone FCH(t).

(1) For the purpose of writing the amplitude data SPD(t) of an input musical tone sampled at the present time t into the memory device D0, a selection control signal SL1 and the calculation control signal CTL respectively represented by

SL1: SELECT(A)
CTL: (Y)=(X)

are outputted from the control signal output register 303 as an operation code OPC, whereby the selector 401 supplies the amplitude data SPD(t) outputted from the sample and hold circuit SPH to the input X of the calculating circuit 402. The calculating circuit 402 outputs the amplitude data SPD(t) inputted to its input A as a calculated value (Y).

(2) Then after an address of the memory device D0 corresponding to the present sampling time t has been designated, for the purpose of writing the output data SPD(t) of the calculating circuit 402 into the designated address a memory type information DLk, a write control signal WR4 and a latch control signal L3 respectively represented by DLn: $DL_0$
$DL_K$: DLD
WR4: "1" (WRITE)
L3: "1" (LATCH)

are outputted from the control signal output register 303 together with a memory number information DLn.

Accordingly, the output information ADR(D0) of the address counter AC(D0) corresponding to the memory device D0 is latched by the latch circuit 306 as a lower order address information for writing the amplitude data SPD(t) at the present time t. In the address information output circuit 309, to the upper order of the lower order address information ADR(D0) is added the memory number information DLN ($=DL_0$) and the memory type information DLk ($=DL_D$) to form a write address information DM.ADR of the amplitude data SPD(t) for the memory device D0, and the formed write address information is outputted. As a consequence the amplitude data SPD(t) at the present time t applied to the data input of the memory device D0 via the calculating circuit 402 is written into an address corresponding to the present time t by the write control signal WR4.

(3) Then, for the purpose of clearing the register R0 storing the synthesized value of the initial reflected tones at respective sampling times, an operation control signal CTL, a write control signal WR1 acting as operation codes and respectively expressed by

CTL: (Y)=0
WR1: "1" (WRITE)

are outputted from the control signal output register 303 together with a register number information RGn expressed by RGn=R0.

Consequently [0] is written into the register R0. In other words, the register R0 is cleared.

(4) Then, for the purpose of forming the first reflected tone $ECH_1$, a memory type information DLk, a control pulse GP1 and a latch control signal L2 acting as operation codes and respectively expressed by DLk: $DL_D$
GP1: "1"
L2: "1" (LATCH)

are outputted from the control signal output register 303 together with an address information OF.ADR-n=OF.ADR$_1$ corresponding to the delay time $i_1$ of the first reflected tone $ECH_1$. In this case, the address information output circuit 309 is storing the memory number information DLn ($=DL_0$) at the step (3).

Consequently, the address information output circuit 309 outputs an address information DM.ADR for reading out from the memory device D0 the amplitude data SPD(t−$i_1$) written before an interval $i_1$ by utilizing the address information OF.ADR$_1$ corresponding to the delay time $i_1$ as a lower order information, and by utilizing the memory number information DLn ($=DL_0$) and the memory type information DLk ($=DL_D$) as the upper order address information, whereby an amplitude data SPD(t−$i_1$), an interval $i_1$ before is read out from the memory device and the amplitude data SPD(t−i) thus read out is latched by the latch circuit by a latch control signal L2.

(5) For the purpose of transferring the present value of the register R0 to the latch circuit 404 a latch control signal L1="1" (LATCH) acting as an operation code and a register number information RGn=R0 are outputted from the control signal output register 303, whereby the present value of the register R0 is transferred to the latch circuit 404 to be stored therein.

(6) Then for the purpose of obtaining an instantaneous value $K_1 \cdot SPD(t-i_1)$ regarding the first reflected tone $ECH_1$ by multiplying an amplitude data SPD(t−$i_1$) before time $i_1$ with an amplitude level controlling coefficient $K_1$, a select control signal SL1=SELECT(B) and an calculation control signal CTL=(A).(X)+(B)=(Y) which constitute an operation code are outputted from the control signal output register 303 together with a constant reading out address information ADR (Kn)=ADR.($K_1$).

Consequently, a coefficient $K_1$ regarding the first reflected tone $ECH_1$ is read out from the coefficient memory device 400 and supplied to the input A of the calculating circuit 402. On the other hand, the selector 401 selects the amplitude data SPD(t−$i_1$), $i_1$ time before and supplied to its input B from the latch circuit 101 and applies the selected data SPD(t−$i_1$) to the input X of the calculating circuit 402 which performs the following calculation.

$$(Y)=(A) \cdot (X)+(B)=K_1 \cdot SPD(t-i_1)+[R0]$$

Since the content of the register R0 has been cleared at step (3) described above, at this time, an instantaneous value $K_1 \cdot SPD(t-i_1)$ regarding the first reflected tone ECH is obtained as the calculated value (Y) of the calculation circuit 402.

(7) Then, for the purpose of transferring the instantaneous value $K_1 \cdot SPD(t-i_1)$ of the first reflected tone $ECH_1$ to the register R0 and to store therein a write control signal WR1="1" (WRITE) acting as the operation code OPC is, outputted from the control signal output register 303 together with a register number information RGn=R0, whereby the output data $(Y)=K_1 \cdot SPD(t-i_1)$ of the calculation circuit 402 is written into the register R0.

When various steps described above are completed, the instantaneous value $K_1 \cdot SPD(t-i_1)$ of the first reflected tone $ECH_1$ can be obtained.

(8) Then the instantaneous values $K_2 \cdot SPD(t-i_2)$ through $K_{10} \cdot SPD(t-i_{10})$ respectively regarding the second to 10th reflected tones $ECH_2$ through $ECH_{10}$ are formed at steps (4) through (7) as a consequence at a time when the step regarding the 10th reflected tone $ECH_{10}$ has completed, the register R0 stores the total sum $$\sum_{n=1}^{10} K_n SPD(t-i)$$

of the instantaneous values of the first to 10th reflected tones $ECH_1$ through $ECH_{10}$, and the total sum is written into the output register 500 by the write control signal WR2 and then transferred to the attenuator 501.

(b) Filter operation (1) For the purpose of reading out from the memory device D10 the amplitude data $SPD(t-j)$, j time before, a memory type information $DLk=DL_D$, latch control signals L3="1" (LATCH) and L2="1" (LATCH) which constitute the operation code OPC are outputted from the control signal output register 303 together with a memory number information $DLn=DL_{10}$. From the address counter AC(D10) corresponding to the memory section D10 is latched by the latch circuit 306 as a lower order address information for reading out the amplitude data $SPD(t-j)$, j time before. The lower order address information ADR(D10) thus latched is added to its upper order the memory number information DLn ($=DL_{10}$) and the memory type information $DL_D$) in the address information output circuit 309 to form a read address information DM.ADR for reading out the amplitude data $SPD(t-j)$ from the memory section D10 of the data memory device 100, whereby the amplitude data $SPD(t-j)$, an interval j before, is read out from the memory section D10 and the read out data is latched by the latch circuit 101 according to the latch control signal L2.

(2) For the purpose of writing the amplitude data SPD(t) sampled at the present time t into the same address from which the amplitude data $SPD(t-j)$ has been read out, a selection control signal SL1=SELECT(A) and a calculation control signal CTL=(Y)=(X) which constitute the operation code are outputted from the control signal output register 303. Consequently, the selector 401 supplies to the input X of the calculation circuit 402, amplitude data SPD(t) outputted from the sample and hold circuit SPH. Furthermore, the calculation circuit 402 outputs the amplitude data SPD(t) inputted to its input X as a calculated value (Y).

(3) For the purpose of writing the amplitude data SPD(t) into the memory section D10 a memory type information $DLk=DL_D$, a write control signal WR4="1" (WRITE), and a latch control signal L3="1" (LATCH) which constitute the operation code OPC, and a memory number information $DLn=DL10$ are outputted from the control signal output register 303. Accordingly, the output information ADR(D10) of the address counter AC(D10) corresponding to the memory section D10 is latched by the latch circuit 306 as a lower order address information for writing the amplitude data SPD(t) at the present time t. In the address information output circuit 309, to the lower order address information $ADR(D_{10})$ thus latched are added the memory number information DLk ($=DL_{10}$) and the memory type information DLk ($=DL_D$) to form and output an address information DM.ADR for writing the amplitude data SPD(t) in the memory section D10. As a consequence, the amplitude data SPD(t) at the present time t applied to the data input of the memory section D10 via the calculation circuit 402 is written into an address corresponding to the present time t by the write control signal WR4.

(4) Then, in the low pass filter LPF, the following equation $$[R1]+K_{11}\cdot SPD(t-j)$$

is calculated according to the content of the register R1, the coefficient $K_{11}$ and the amplitude data $SPD(t-j)$, j time before. For storing again the calculated value in the register R1, a latch control signal L1="1" (LATCH) acting as the operation code OPC and a register number control signal RGn=R1 are outputted from the control signal output register 302 and the content of the register R1 is transferred to the latch circuit 404.

(5) For the purpose of calculating $K_{11}\cdot SPD(t-j)$, the control signal output register 303 outputs a selection control signal SL1 (SELECT (B)) and a calculation control signal CTL which constitute the operation code OPC and a constant read out address information ADR (Kn).

Consequently, a coefficient $K_{11}$ is read out from the coefficient memory device 400 and supplied to the input A of the calculating circuit 402. The selector 401 selects the amplitude data $SPD(t-j)$ which was latched in the latch circuit 101 at the preceding step b-(1) and supplies the selected data $SPD(t-j)$ to the input X of the calculation circuit 402. Accordingly, the calculation circuit 402 calculates the following equation $$(Y)=(A)\cdot(X)+(B)=K_{11}\cdot SPD(t-j)+R1$$

At this time, since the content of the register R1 has been cleared at a time when the filtering processing at the previous sampling time (t−1) has completed, data $K_{11}\cdot SPD(t-j)$ is obtained as the calculated value (Y) at this step.

(6) For the purpose of storing this calculated value $(Y)=K_{11}SPD(t-j)$ in the register R1, the control signal output register 303 outputs a write control signal WR1="1" (WRITE) utilized as the operation code OPC and a register number informatin RGn=R1, whereby the output data $K_{11}\cdot SPD(t-j)$ of the calculation circuit 402 is stored in the register R1.

(7) Then for the purpose of reading out the amplitude data $SPD(t-j-1)$, a (j−1) interval before, the control signal output register 303 outputs a memory type information $DL_K=DL_{SD}$, a latch control signal L2="1" (LATCH), and a gate pulse signal GP2="1" which constitute the operation code OPC, and a memory number signal $DLn=DL_0$. Then the address information output circuit 309 changes to "0" all bits of the lower order address information and adds the memory type information DLk ($=DL_{SD}$) and the memory number information DLN ($=DL_o$) to the upper order to form and output an address information DM.ADR for the memory section SD0, whereby the amplitude data $SPD(t-j-1)$, a (j−1) time before, is read out from the memory section SD0 and latched by the latch circuit 101.

(8) Then an equation $$K_{12}\cdot SPD(t-j-1)+[R1]$$

is calculated in accordance with the content $K_{11}\cdot SPD(t-j)$ of the register R1, the coefficient $K_{12}$, and the amplitude data $SPD(t-j-1)$ latched in the latch circuit 101, and for the purpose of storing again the calculated value in the register R1, the control signal output register 303 outputs a latch control signal $L1="1"$ (LATCH) acting as the operation code OPC and a register number information $RGn=R1$ so as to transfer the content $K_{11}\cdot SPD(t-j)$ of the register R1 to the latch circuit 404.

(9) Then, for the purpose of calculating an equation $$K_{12}\cdot SPD(t-j-1)+[R1]$$

the control signal output register 303 outputs a signal $SL1=SELECT$ (B) and a signal $CTL=(Y)=-(A)\cdot(X)+(B)$ which constitute the operation code OPC and an address information $ADR(Kn)=ADR(K_{12})$, whereby a coefficient $K_{11}$ is read out from the coefficient memory device 400 and then applied to the input of the calculation circuit 402. The selector 401 selects the amplitude data $SPD(t-j-1)$ latched in the latch circuit 101 and supplies it to the input x of the calculation circuit 402. Hence this circuit 402 outputs the result of calculation (Y) of the following equation $$(Y)=-(A)\cdot(X)+(B)=K_{12}\cdot SPD(t-j-1)+K_{11}\cdot SPD(t-j)$$

This calculated value Y is stored in the resisters R1 and R2 in the next step so that their contents are changed as follows.

$$[R1]=[R2]=K_{12}\cdot SPD(t-j-1)+K_{11}\cdot SPD(t-j)$$

(10) For the purpose of calculating an equation $K_{13}SPD(t-j-1)+[R2]$ by utilizing the content of the register R2, the coefficient $K_{12}$, and the amplitude data $SPD(t-j-1)$, a $(j-1)$ before and stored in the memory section SD0, the amplitude data $SPD(t-j-1)$ is read out from the memory section SD0 and latched in the latch circuit 101 in the same manner as in steps (b)-(7).

(11) In the same manner as the step (b)-(8), the content $K_{12}\cdot SPD(t-j-1)+K_{11}\cdot SPD(t-j)$ of the register R2 is transferred to the latch circuit 404.

(12) Then for the purpose of reading out the coefficient $K_{13}$ to calculate an equation $K_{13}\cdot SPD(t-j-1)+[R2]$, the control signal output register 303 outputs a signal $SL1=SELECT(B)$, and $CTL=(Y)=(A)\cdot(X)+(B)$ which constitute the operation code OPC and an address information $ADR(Kn)=ADR(k_{13})$, whereby a coefficient $K_{11}$ is read out from the coefficient memory device 400 and supplied to the input A of the calculation circuit 402. The selector 401 selects the amplitude data $SPD(t-j-1)$ latched in the latch circuit 101 and supplies it to the input X of the calculation circuit 402, whereby it calculates an equation $$\begin{aligned}(Y) &= (A)\cdot(X) + (B) \\ &= K_{13}\cdot SPD(t-j-1) + K_{12}\cdot SPD(t-j-1) \\ &= K_{11}\cdot SPD(t-j)\end{aligned}$$

This calculated value (Y) is stored in the register R2 at the next step and then applied to the high pass filter HPF from this register R2.

(13) At the last step of the low pass filter LPF, for the purpose of writing the content of the register R1 in the memory section SD0 for use at the next sampling time $(t+1)$, at first the content $K_{12}\cdot SPD(t-j-1)+K_{11}\cdot SPD(t-j)$ of the register R1 is transferred to the latch circuit 404 in the same manner as the step (b)-(8) for causing the operation circuit 402 to calculate $(Y)=(B)$. The calculated value $(Y)=K_{12}\cdot SPD(t-j-1)+K_{11}\cdot SPD(t-j)$ is written in the memory section SD0. This writing operation is performed by outputting the operation code OPC constituted by $DLk=DL_{SD}$, $GP2="1"$ and $WR4="1"$, and a memory number information $DLn=DL_o$ from the control signal output register 303.

After the operation of the low pass filter LPF completes, the high pass filter HPF operate in the same manner.

The formation of a reverberation tone $RVD^1$ having a large delay time interval will now be described.

(c) Formation of the reverberation tone $RVD_1$ (1) At first, the data $SPD(t-j)$ stored in the register R4 of the high pass filter HPF is multiplied with a coefficient $K_{17}$ and for the purpose of storing the product $K_{17}\cdot SPD(t-j)$ in the register R5, a latch control signal $L1="1"$ (LATCH), and a register number information $RG_n$ are outputted from the register 303 and the content $SPD(t-j)$ of the register R4 is transferred to the latch circuit 404.

(2) Then for the purpose of calculating data $K_{17}\cdot SPD(t-j)$ the control signal output register 303 outputs a selection control signal $SL1=SELECT(c)$, a calculation control signal $CTL=(Y)=(A)\cdot(X)$ and a coefficient read address information $ADR(Kn)=ADR(K_{17})$, whereby a coefficient $K_{17}$ is read out from the coefficient memory device 400 and applied to the input A of the calculation circuit. The selector 401 selects the data $SPD(t-j)$ latched in the latch circuit 404 and applies it to the input X of the calculation circuit 402, whereby the calculation circuit calculates the following equation $$(Y)=(A)\cdot(X)=K_{17}\cdot SPD(t-j)$$

and this calculated value Y is stored in the register R5 in the next step.

(3) Then, for the purpose of reading out the amplitude data $SPD(t-x_1)$, $x_1$ interval before from the memory device D1, adding the read out data to the present value of the register R11 and storing again the sum in the register R11, the control signal output register 303 outputs a latch control signals $L3="1"$ (LATCH) and $L2="1"$ (LATCH) a memory number information $DLn=DL_1$ and a memory type information $DLk=DL_D$, whereby the output information $ADR(D1)$ of the address counter $AC(D1)$ corresponding to the memory section D1 would be latched in the latch circuit 306 as a lower order information for reading out the amplitude data $SPD(t-x_1)$. The memory number information DLn and the memory type information DLk are added to the upper order of the lower order address information $ADR(D1)$ to form an address information DM.ADR for the memory section D1 of the data memory device 100. Consequently, the amplitude data $SPD(t-x_1)$, $x_1$ time before is read out from the memory section D1 and latched by the latch circuit 101.

(4) To add together the read out data $SPD(t-x_1)$ and the present value of the register R11, the content of the register R11 is transferred to the latch circuit 404 and thereafter the control signal output register 303 outputs a selection control signal SL1=SELECT(B) and a calculation control signal $CTL=(Y)=(X)+(B)$.

Then the selector 401 selects the amplitude data SPD(t−x₁) latched in the latch circuit 101 and supplies it to the input X of the calculation circuit 402, whereby the calculation circuit 402 calculates an equation $$(Y)=(X)+(B)=[R11]+SPD(t-x_1)$$

Before this time, the content of the register R11 has ben cleared at a time when the operation at the preceding sampling time (t−1) was completed, so that the calculated value Y at this step (4) is equal to SPD(t−x₁). Thereafter, the calculated value Y is transferred to the register R11 to be stored therein.

(5) Then, for the purpose of reading out the amplitude data SPD(t−x₁) from the memory device D1, multiplying the amplitude data with a coefficient K₁₈, and for storing again the sum of the product K₁₈·SPD(t−x₁) and the content K₁₇·SPD(t−j) of the register R5 in the register R6, the content K₁₇·SPD(t−j) of the register R5 is transferred to the latch circuit 404 in the same manner as in the step (c)-(1).

(6) Then, for the purpose of calculating equation $$(Y)=K_{18}\cdot SPD(t-x_1)+K_{17}\cdot SPD(t-j)$$

based upon the the amplitude data SPD(t−x₁) latched by the latch circuit 101, the data latched by the latch circuit 404 and the coefficient K₁₈, the control signal output register 303 outputs a selection control signal SL1=SELECT(B), a calculation control signal $CTL=(Y)=(A).(X)+(B)$, and a coefficient read out information ADR(Kn)=ADR(K₁₈), whereby the coefficient K₁₈ is read out from the coefficient memory device 400 and applied to the input A of the calculation circuit 402. On the other hand, the selector 401 selects the amplitude data SPD(t−x₁) latched by the latch circuit 101 and applies it to the input X of the calculation circuit 402, whereby this calculation circuit calculates an equation $$(Y)=(A)\cdot(X)+(B)=K_{18}\cdot SPD(t-x_1)+K_{17}\cdot SPD(t-j)$$

This calculated value Y is written into an address of the memory section D1 corresponding to the present time t via the register R6 in the next step. Thereafter, the register R6 is cleared for processing a system including the memory section D2.

(7) Then the processings regarding the systems respectively including memory sections are executed in the same manner as steps (c)-(3) through (c)-(6). Upon completion of the processings of respective systems respectively including memory sections D1 through D9, the register R11 produces an information regarding a reverberation tone RVD¹ represented by $$RVD^1(t) = \sum_{n=1}^{9} SPD(t-x_n)$$

The operation of forming a reverberation tone RVD² having a short delay time interval will now be described.

(d) Formation of the reverberation tone RVD²

(1) For the purpose of reading out the amplitude data RVD¹(t−y₁) from the memory section MD0, the control signal output register 303 outputs a latch control signal L3="1" (LATCH) and L2="1" (LATCH), a memory number information DLk=DL_MD and a memory type information DLk=DL_MD. Consequently, in the same manner as the step (c)-(3), an address information DM.ADR for the memory section MD0 is formed in the address information output circuit 309 for reading out the amplitude data RVD¹(t−y₁), a y₁ time before, from the memory section MD0. This read out data RVD¹(t−y₁) is latched by the latch circuit 101.

(2) The, data $$K_{30}\cdot RVD^1(t-y_1)+RVD^1(t)$$

is calculated by using the amplitude data RVD¹(t−y₁) latched by the latch circuit 101, the output data RVD¹(t) of the register R11 and the coefficient K₃₀. Then to store the calculated value Y in the register R12, after transferring the output data RVD¹ from the register R11 to the latch cirucit 401, the control signal output register 303 outputs a selection control signal SL1=SELECT(B), a calculation control signal SL1=SELECT(B), a calculation control signal $CTL=(Y)=(A).(X)+(B)$, and a coefficient read address information ADR(Kn)=ADR(K₃₀). As a consequence, the coefficient K₃₀ is applied to the input A of the calculation circuit 402 in the same manner as the step (c)-(6) described above, and the data RVD¹(t−y₁) is supplied to the input X of the calculation circuit 402, with the result that the calculation circuit calculates an equation $$(Y)=(A)\cdot(X)+(B)=K_{30}\cdot RVD^1(t-y_1)+RVD^1(t)$$

and this calculated value (Y) is stored in the register R12 at the next step.

(3) Then, for the purpose of multiplying the content [K₃₀·RVD¹(t−y₁)+RVD¹(t)] of the register R12 with a coefficient K₂₉, the content of the register R12 is transferred to the latch circuit 404 and the control signal output register 303 outputs a selection control signal SL1=SELECT(C), a calculation control signal $CTL=Y=(A).(X)$ and a coefficient read address information ADR(Kn)=ADR(K₂₉).

Accordingly, the coefficient K₃₀ is applied to the input A of the calculation circuit 402, while the data [K₃₀·RVD¹(t−y₁)+RVD¹(t)] is being supplied to the input X of the calculation circuit 402, with the result that the calculation circuit 402 calculates an equation $$(Y)=(A)\cdot(X)=K_{29}[K_{30}\cdot RVD^1(t-y_1)+RVD^1(t)]$$

This calculated value Y is stored in the register R13 at the next step.

(4) Then, for the purpose of adding the content of the register R13 to the data RVD¹(t−y₁), y₁ time before, and storing again the sum in the register R13, in the same manner as the step (d)-(1), the data RVD¹(t−y₁), y₁ time before is read out from the memory section MD0 and latched by the latch circuit 101. After transferring the content K₂₉·[K₃₀·RVD¹(t−y₁)+RVD¹(t)] of the register R13 to the latch circuit 404, the control signal output register 303 produces a selection control signal SL1=SELECT(B) and a calculation control signal CTL, whereby the calculating circuit 402 produces a calculated value Y shown by $$(Y) = (B) + (X)$$

-continued
$$= RVD^1(t - y_1) + K_{29} \cdot [K_{30} \cdot RVD^1(t - y_1) + RVD^1(t)]$$

This calculated value Y is stored in the resistor R13 and then outputted as a reverberation tone information $RVD^{2A}$ at the next step.

(5) Then the content of the register R12 is written into an address of the memory section MD0 corresponding to the present time t for the purpose of utilizing the content $[K_{30} \cdot RVD^1(t-y_1)+RVD^1(t)]$ of the register R12 at a sampling time $(t+y_1)$ later by a time $y_1$.

(6) Thereafter a reverberation tones $RVD^{2B}$ and $RVD^{2C}$ having shorter intervals than (t) are formed in the same manner.

Although in the embodiment shown in FIGS. 1 and 2, a bandpass filter 16 provided, it may be omitted in a certain case. Furthermore, as shown in the performance block diagram shown in FIG. 13, the data may be divided into 3 frequency bands by using a high pass filter HPF, a bandpass filter BPF and a low pass filter LPF for forming different reverberation tones for respective frequency bands in the first reverberation tone forming unit 2. This can readily be realized by changing the content of a control program.

Figure 14:
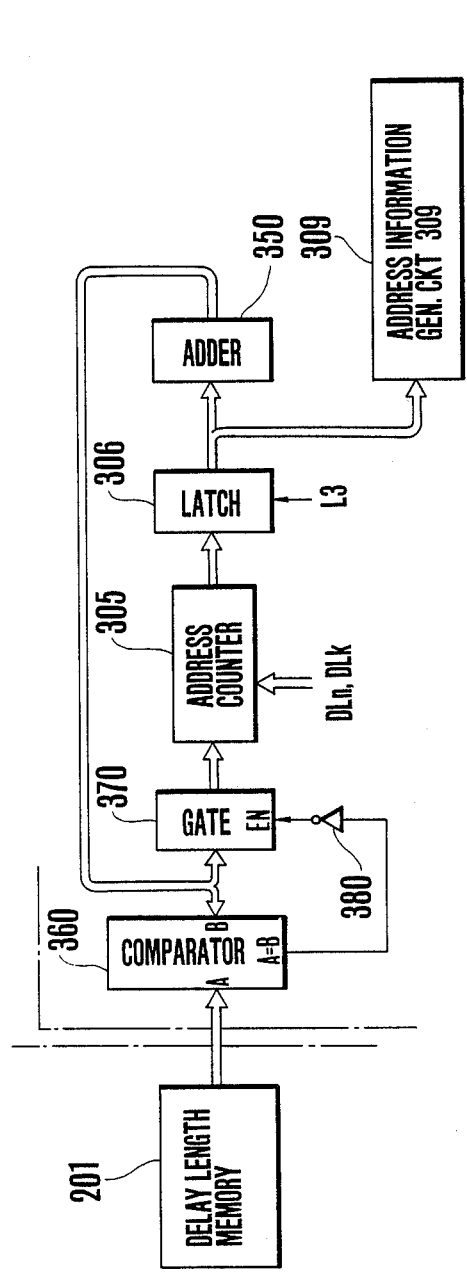
FIG. 14 is a block diagram showing a modification of the address information generator.

It should be understood that the invention is not limited to the specific embodiment described above and that various changes and modifications may be made without departing from the true siprit and scope of the invention as defined in the appended claims. For example, FIG. 14 shows a modification of the address information generator 30 shown in FIG. 1 in which a delay length information $DLD^m(n)$ sent from the delay length memory device 201 is compared by a comparator 360 with the output of a +1 adder 350 which adds +1 to the output of a latch circuit 306 which latches the output of an address counter 305. The comparator 360 is supplied with the delay time information $DLD^m(n)$ at its input A and the output of the adder 350 at its input B. Where both input signals are not equal, the comparator 360 does not produce any output. Consequently, the output of the adder 350 is stored via a gate circuit 370 in the address counter 305 constituted by a RAM at a position thereof selected by the memory number information DLn and the memory type information DLk, and read out again from that position.

When the two inputs to the comprator 360 coincide with each other, an output is sent to an inverter 380 from an A=B output terminal to stop the output of the inverter 380 which has been supplied to an enabling terminal EN of the gate circuit 370. Thus, at this time since no input is applied to the position of the address counter 305 selected by the information DLn and DLk, the address counter would be cleared to return to the initial state. The output to the address information circuit 309 is derived out from the latch circuit in the same manner as in FIG. 1.

For the modified address information generator shown in FIG. 14, the address information DM.ADR adapted to read out a delay informatin from the memory device 150 can be formed in the same manner as above described.

Figure 15:
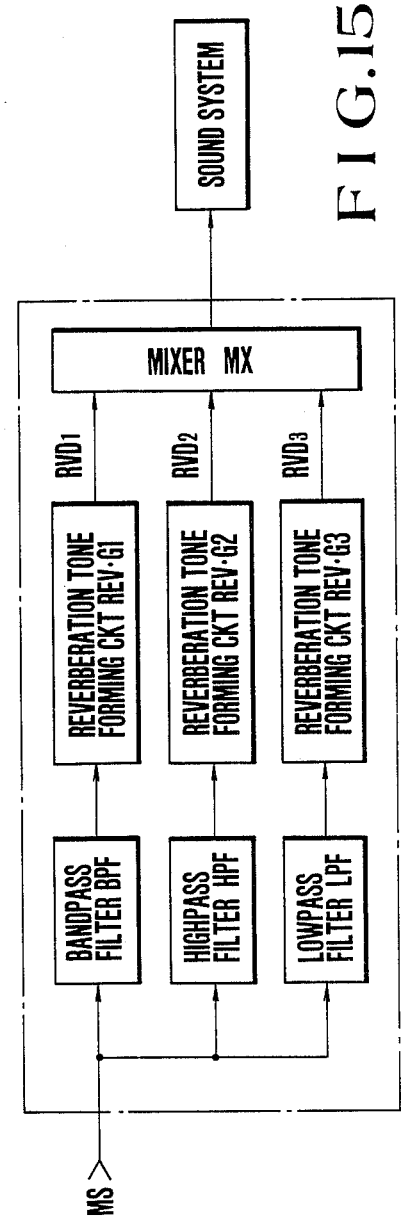
FIG. 15 is a block diagram showing a modified embodiment of this invention.

In the following, modifications of this invention will be desdribed wherein an input musical tone is divided into a plurality of frequency bands so as to generate and add independent reverberation tones to respective frequency bands FIG. 15 shows the principle of this modified reverberation tone generating apparatus in which an input musical tone signal is commonly applied to a bandpass filter, BPF, a high pass filter HPF and a low pass filter LPF. Thus, the input musical tone signal MS is divided into three frequency bands by these filters and the separated signals are applied to respective reverberation tone forming circuits $REV.G_1$, $REV.G_2$ and $REV.G_3$ which form reverberation tone signals $REV_1$, $REV_2$ and $REV_3$ having different delay time lengths and amplitudes in response to the input musical tone signal divided into 3 frequency bands. The reverberation tone signals $REV_1$ through $REV_3$ are mixed together by a mixer MX and then produced as reverberation tones to be added to the input musical tone by a sound system SS. Where a musical tone is produced in an ordinary house room, the delay time of the reverberation tone forming circuit $REV.G_3$ supplied with the output signal of the lowpass filter LPF is set to be shorter than that of the reverberation tone forming circuit $REV.G_2$ supplied with the output signal of the high pass filter HPF. In this manner, a reverberation tone having uniform reverberation characteristics over the entire frequency bands can be formed.

FIGS. 16a, 17a, 18a, 19a and 20a show modifications of the embodiment shown in FIG. 15 in which depending upon the tone colors of the performed tone of such musical instruments as a flute, a string ensemble, an organ, etc., the relative connections of the reverberation tone forming circuit $REV.G_1$ through $REV.G_3$, the low pass filter LPF, the high pass filter HPF, and the bandpass filter BPF, the frequency characteristics of respective filters, the reverberation tone lengths and depths formed by the reverberation tone forming circuits are changed. With these modifications, it is possible to generate reverberation tones having different reverberation characteristics as shown in FIGS. 16b, 17b, 18b, 19b and 20b. Similar reverberation tones can also be added to a rhythm tone. The constructions of the circuits shown in FIGS. 16a through 20a and the characteristics shown in FIGS. 16b through 20b respectively correspond to tone colors of a flute, a string ensemble, an organ, a saxophone, a vibraphone, and a trumpet as shown in the following Table III.

TABLE III

Figure 18B:
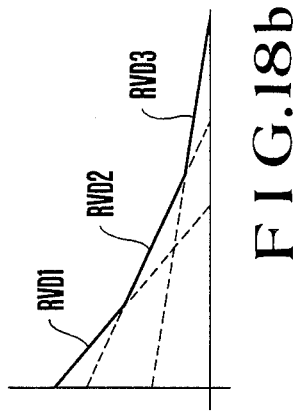
Figure 19B:
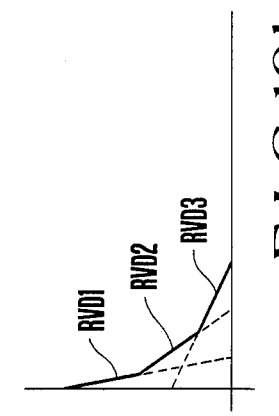
Figure 18A:
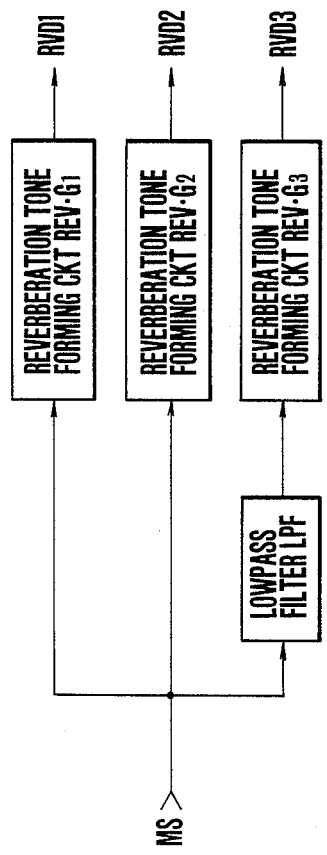
Figure 19A:
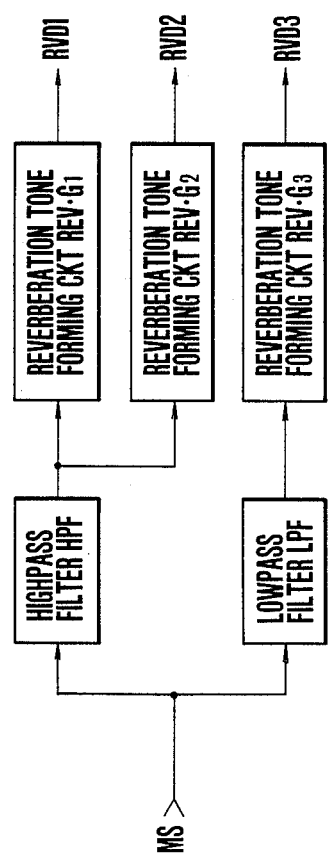
Figure 20B:
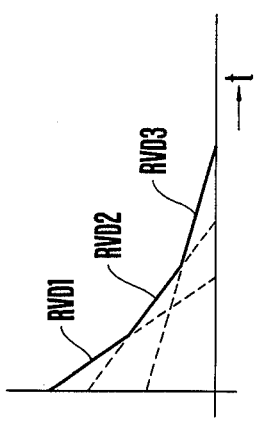
Figure 20A:
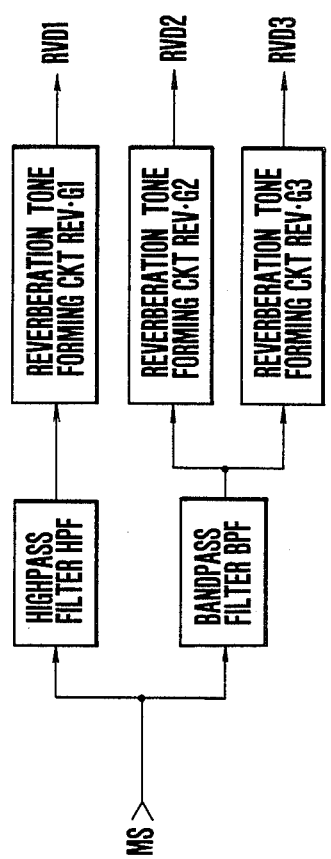

| tone color | construction | characteristics | length of residual tone | depth |
|---|---|---|---|---|
| flute | FIG. 16a | FIG. 16b | short (about 1 ms) | medium |
| string ensemble | FIG. 17a | FIG. 17b | medium (about 2 ms) | slightly deep |
| organ | FIG. 18a | FIG. 18b | long (about 3 ms) | deep |
| saxophone | FIG. 19a | FIG. 19c | short | shallow |
| vibraphone | FIG. 16a | FIG. 16b | short | shallow |
| tranpet | FIG. 20a | FIG. 20b | medium | medium |

Figure 21:
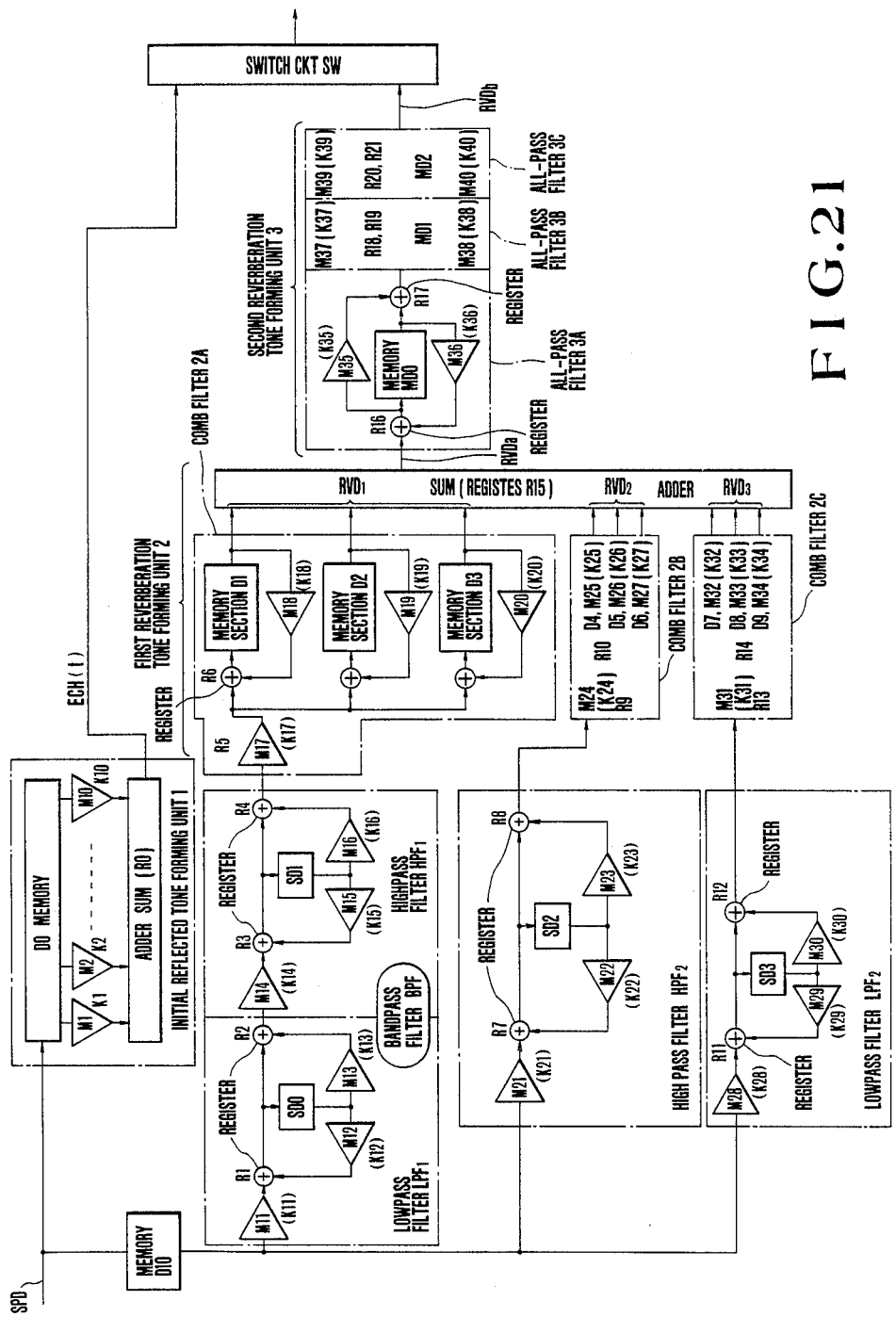
FIG. 21 is a block diagram showing still another embodiment of this invention.

The circuit construction of the reverberation tone generating apparatus for producing different reverberation tohes described above is identical to that shown in FIG. 1 and the functional block diagram thereof is shown in FIG. 21.

Figure 13:
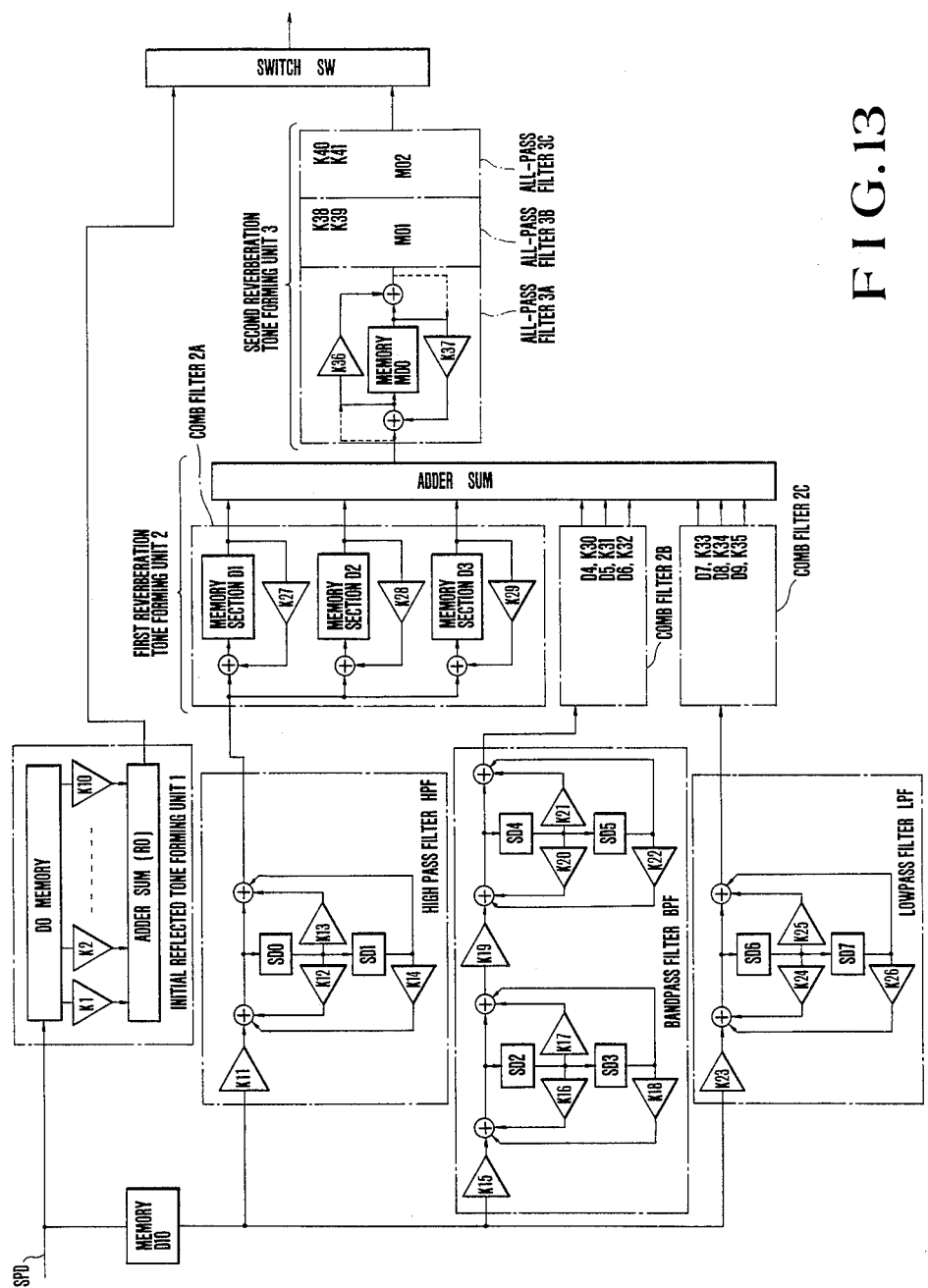
FIG. 13 is a functional block diagram showing another embodiment of the reverberation tone generating apparatus according to this invention.

The functional block diagram shown in FIG. 21 has substantially the same construction as that shown in FIG. 13 except that the bandpass filter BPF is constituted by a low pass filter $LPF_1$ and a high pass filter $HPF_1$, that the high pass filter HPF in FIG. 13 is shown as HPF$_2$ in FIG. 21, and that the low pass filter LPF shown in FIG. 13 is shown as LPF$_2$ in FIG. 21. However the high pass filter HPF$_2$ and the low pass filter LPF$_2$ are constructed similar to the filters HPF$_1$ and LPF$_2$ in the band pass filter BPF so that an amplitude data SPD(t−j) removed with low and high frequency components in given frequency bands is applied to the first reverberation tone forming unit.

Furthermore, comb filter type delay circuits 2A, 2B and 2C having different delay times are provided between the adder SUM and the band pass filter BPF$_1$, the high pass filter HPF$_2$ and the low pass filter LPF$_2$ the operation of the circuit shown in FIG. 21 is generally similar to that of FIG. 13. In this case, the content of the register R15, when all processings of the delay circuit 2A through 2C have completed, is expressed by $$RVD_a = RVD_1 + RVD_2 + RVD_3$$
$$= SPD(t - x_1) + SPD(t - x_2) + SPD(t - x_3) +$$
$$SPD(t - x_4) + SPD(t - x_5) + SPD(t - x_6) +$$
$$SPD(t - x_7) + SPD(t - x_8) + SPD(t - x_9)$$

which is equal to the content RVD$_1$ of register R11. Consequently, reverberation tones whose amplitude levels and delay times vary regulaly as shown in FIG. 13 can be produced.

The reverberation tone data RVD$_1$, RVD$_2$ and RVD$_3$ for respective frequency bands formed by delay circuits 2A through 2C respectively are synthesized by the adder SUM to produce a reverberation tone data RVD$_a$ which is applied to a second reverberation tone forming unit 3A constituted by serially connected delay circuits 3A, 3B and 3C identical to those shown in FIG. 13.

The purpose of providing the second reverberation tone forming unit 3 is to form reverberation tone data RVD$_b$ having shorter delay timne spacings based on the reverberation tone data RVD$_a$ formed by the first reverberation tone forming unit 2.

The operatin of the circuit shown in FIG. 21 can readily be understood from the descriptions regarding FIGS. 2 and 13.

As above described in the reverberation tone generating apparatus embodying the invention, a digital memory device is used as a delay element, so that even when the reverberation time is elongated the S/N ratio would not be lowered, thus enabling to produce a reverberation tone having the same quality as the natural reverberation tone. Moreover, the reverberation time can be varied as desired by changing address spacing of the digital memory device. Moreover, it is possible to commonly use a single calculation circuit on the time division basis, thus simplifying the circuit construction. Since a reverberation tone whose delay time and amplitude level are irregular, and a reverberation tone whose delay time and amplitude level are regular are formed by independent circuits, there is an additional advantage that reverberation tones having complicated characteristics can be formed with a small scale circuit.

In other words, according to the modified embodiments of this invention, an optimum reverberation effect can be added to a musical tone suitable for the tone color of a performed musical tone and a place of performance.

What is claimed is:

1. A digital reverberation tone generating apparatus having musical tone signals input thereto, comprising:
    memory means having a plurality of memory areas, each of which are used as delay elements, wherein said memory areas comprise a plurality of first memory areas of a first reverberation tone forming unit and a plurality of second memory areas of a second reverberation tone forming unit;
    delay time information generating means for generating delay time information that determines delay times for each of said memory areas used as delay elements;
    memory address generating means for generating write address information for identifying write addresses designating locations of said memory areas to store amplitude samples of musical tone signals respectively at a present time and read address information for identifying read addresses, equal to said write addresses, designating locations of said memory areas to read out said stored amplitude samples after the lapse of the time designated by said delay time information, said memory areas storing and outputting said stored amplitude samples in response to said write address information and read address information respectively;
    coefficient generating means for generating coefficients corresponding to said memory areas respectively;
    calculating means for modifying said stored amplitude samples outputted from said memory areas in accordance with corresponding ones of said coefficients generated from said coefficient generating means;
    program control means including a first program which provides a sequence of generation of said delay time information, said write address information, and said read address information, said memory address generating means and said coefficient generating means generating said delay time information, said read address information, said write address information and said coefficients in accordance with said program, said program control means further including a second program for controlling the coupling of each of said first and second memory areas, wherein said second program couples said first memory areas in parallel and said second memory areas in series and wherein said second program also forms a feedback loop for each of said memory areas of said first and second memory areas; and
    reverberation tone producing means for producing a reverberation tone in accordance with said stored amplitude samples of musical tone signals modified by said calculating means.

2. A digital reverberation tone generating apparatus according to claim 1 wherein said reverberation tone producing means further comprises sampling means for sampling said stored amplitude samples of musical tone signals at a predetermined period and outputting said amplitude samples as a sampled result.

3. A digital reverberation tone generating apparatus according to claim 1 or 2 wherein said memory address generating means comprises a pulse generator for generating clock pulses; a counter device which counts the number of said clock pulses and produces said write address information; and calculating means for calculating based on said write address information and said delay time information and for outputting said read address information.

4. A digital reverberation tone generating apparatus according to claim 1 or 2 wherein said memory address generating means comprises a pulse generator for producing clock pulses; and a counter device which counts the number of said clock pulses and outputs said read address information and said write address information, wherein said read address information and said write address information are the same.

5. A digital reverberation tone generating apparatus according to claim 4 wherein said counter device comprises a counter and determining means for determing a count period of said counter.

6. A digital reverberation tone generating apparatus according to claim 4 wherein said counter device is a presettable counter.

7. A digital reverberation tone generating apparatus according to claim 4 wherein said counter device comprises a counter, a comparator for comparing said delay time information with an output of said counter, means for setting a count of said counter to an initial value in accordance with an output of said comparator, and increasing means for increasing the count of said counter at a predetermined period.

8. A digital reverberation tone generating apparatus according to claim 1 or 2 wherein a plurality of said memory areas, and said delay time information generating means are provided for forming a plurality of reverberation tones having different delay times for said stored amplitude samples of musical tone signals.

9. A digital reverberation tone generating apparatus according to claim 3 wherein said counter device comprises a presettable down counter.

10. A digital reverberation tone generating apparatus according to claim 1 wherein said plurality of first memory areas store a first given number of said amplitude samples and said plurality of second memory areas store a second given number of said amplitude samples, said first number being smaller than said second number.

11. A digital reverberation tone generating apparatus according to claim 1 wherein said memory address generating means is operated on a time division basis.

12. A digital reverberation tone generating apparatus according to claim 11 which further comprises a reverberation tone pattern setter for designating a pattern of the reverberation tone to be generated and a control signal generator responsive to an output of said setter for producing various control signals adapted to control said memory means, said delay time information generating means, and said memory address generating means.

* * * * *